United States Patent
Lin et al.

(10) Patent No.: US 11,790,990 B2
(45) Date of Patent: Oct. 17, 2023

(54) CONTENT ADDRESSABLE MEMORY DEVICE, CONTENT ADDRESSABLE MEMORY CELL AND METHOD FOR SINGLE-BIT MULTI-LEVEL DATA SEARCHING AND COMPARING

(71) Applicant: MACRONIX INTERNATIONAL CO., LTD., Hsinchu (TW)

(72) Inventors: Yu-Hsuan Lin, Taichung (TW); Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/717,192

(22) Filed: Apr. 11, 2022

(65) Prior Publication Data

US 2023/0238061 A1 Jul. 27, 2023

Related U.S. Application Data

(60) Provisional application No. 63/302,992, filed on Jan. 25, 2022.

(51) Int. Cl.
*G11C 15/04* (2006.01)
*G11C 7/14* (2006.01)

(52) U.S. Cl.
CPC .............. *G11C 15/046* (2013.01); *G11C 7/14* (2013.01)

(58) Field of Classification Search
CPC ......... G11C 15/046; G11C 15/02; G11C 7/14; G11C 7/1096
See application file for complete search history.

(56) References Cited

U.S. PATENT DOCUMENTS

| 6,317,349 B1 | 11/2001 | Wong |
| 10,453,531 B1 | 10/2019 | Petti |
| 2020/0075099 A1 | 3/2020 | Choi et al. |

FOREIGN PATENT DOCUMENTS

| CN | 115985369 A | * | 4/2023 |
| WO | 2013055831 A1 | | 4/2013 |

OTHER PUBLICATIONS

Operation Method of Memory, Memory And Memory System (Year: 2022).*

* cited by examiner

*Primary Examiner* — Sultana Begum
(74) *Attorney, Agent, or Firm* — McClure, Qualey & Rodack, LLP

(57) ABSTRACT

The application provides a content addressable memory (CAM) memory device, a CAM memory cell and a method for searching and comparing data thereof. The CAM memory device includes: a plurality of CAM memory cells; and an electrical characteristic detection circuit coupled to the CAM memory cells; wherein in data searching, a search data is compared with a storage data stored in the CAM memory cells, the CAM memory cells generate a plurality of memory cell currents, the electrical characteristic detection circuit detects the memory cell currents to generate a plurality of sensing results, or the electrical characteristic detection circuit detects a plurality of match line voltages on a plurality of match lines coupled to the CAM memory cells to generate the plurality of search results; and the storage data is a single-bit multi-level storage data and/or the search data is a single-bit multi-level search data.

21 Claims, 18 Drawing Sheets

CONTENT ADDRESSABLE MEMORY DEVICE, CONTENT ADDRESSABLE MEMORY CELL AND METHOD FOR SINGLE-BIT MULTI-LEVEL DATA SEARCHING AND COMPARING

This application claims the benefit of U.S. provisional application Ser. No. 63/302,992, filed Jan. 25, 2022, the subject matter of which is incorporated herein by reference.

BACKGROUND OF THE INVENTION

Field of the Invention

The invention relates in general to a content addressable memory (CAM) memory device, a CAM memory cell and a method for searching and comparing data thereof, and more particularly to a CAM memory device, a CAM memory cell and a method for searching and comparing data thereof, which are capable of implementing in-memory approximate searching.

Description of the Related Art

Along with the booming growth in big data and artificial intelligence (AI) hardware accelerator, data search and data comparison have become essential functions. The existing ternary content addressable memory (TCAM) can be configured to implement highly parallel searching. Conventional TCAM is normally formed by static random access memory (SRAM), and therefore has low memory density and requires high access power. Recently, a non-volatile memory array based on TCAM has been provided to save power consumption through dense memory density.

In comparison to the TCAM based on SRAM having 16 transistors (16T), recently a resistive random access memory (RRAM)-based TCAM having 2-transistor and 2-resistor (2T2R) structure has been provided to reduce cell area. Also, standby power consumption can be reduced through the non-volatile RRAM-based TCAM.

Table 1 shows number expression in binary system, and table 2 shows matched bit count.

TABLE 1

|   | $2^1$ | $2^0$ |
|---|---|---|
| 0 | 0 | 0 |
| 1 | 0 | 1 |
| 2 | 1 | 0 |
| 3 | 1 | 1 |

TABLE 2

|   | 0 | 1 | 2 | 3 |
|---|---|---|---|---|
| 0 | 2 | 1 | 1 | 0 |
| 1 | 1 | 2 | 0 | 1 |
| 2 | 1 | 0 | 2 | 1 |
| 3 | 0 | 1 | 1 | 2 |

As for the number 1 and 2, the number 1 and 2 are expressed as "01" and "10" in binary system, respectively. Thus, the matched bit count between 1 and 2 is 0. As for the number 1 and 3, the number 1 and 3 are expressed as "01" and "11" in binary system, respectively. Thus, the matched bit count between 1 and 3 is 1. However, the distance between 1 and 2 is smaller than the distance between 1 and 3.

That is, the matched bit count cannot well present the correlation between two numbers and this will cause accuracy degradation.

Therefore, it has become a prominent task for the industries to provide a CAM memory device, a CAM memory cell and a method for searching and comparing data thereof, which are capable of well presenting the correlation between two numbers in good accuracy.

SUMMARY OF THE INVENTION

According to one embodiment of the present invention, a CAM memory device is provided. The content addressable memory (CAM) memory device includes: a plurality of CAM memory cells; and an electrical characteristic detection circuit coupled to the CAM memory cells; wherein in data searching, a search data is compared with a storage data stored in the CAM memory cells, the CAM memory cells generate a plurality of memory cell currents, the electrical characteristic detection circuit detects the memory cell currents to generate a plurality of sensing results, or the electrical characteristic detection circuit detects a plurality of match line voltages on a plurality of match lines coupled to the CAM memory cells to generate the plurality of search results; and the storage data is a single-bit multi-level storage data and/or the search data is a single-bit multi-level search data.

According to one embodiment of the present invention, a method for searching and comparing data of a CAM memory device is provided. The method includes: storing a storage data in a plurality of CAM memory cells; performing data searching on the CAM memory cells by a search data; generate a plurality of memory cell currents from the CAM memory cells; and detecting the memory cell currents to generate a plurality of sensing results, or detecting a plurality of match line voltages on a plurality of match lines coupled to the CAM memory cells to generate the plurality of search results; wherein the storage data is a single-bit multi-level storage data and/or the search data is a single-bit multi-level search data.

According to an alternate embodiment of the present invention, a CAM memory cell is provided. The CAM memory cell includes: a first memory cell and a second memory cell coupled to each other; wherein the first memory cell and the second memory cell receive a first search voltage and a second search voltage representing a search data; wherein a storage data of the CAM memory cell is a single-bit multi-level storage data and/or the search data is a single-bit multi-level search data.

The above and other aspects of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

One embodiment of the application provides a CAM memory device, a CAM memory cell and a method for searching and comparing data thereof. A single-bit multi-level search data and a single-bit single-level CAM memory cell are used to generate different levels of mismatch output signals.

One embodiment of the application provides a CAM memory device, a CAM memory cell and a method for searching and comparing data thereof. A single-bit single-level search data and a single-bit multi-level CAM memory cell are used to generate different levels of mismatch output signals.

One embodiment of the application provides a CAM memory device, a CAM memory cell and a method for searching and comparing data thereof. A single-bit multi-level search data and a single-bit multi-level CAM memory cell are used to generate different levels of mismatch output signals.

First Embodiment

Figure 1A:
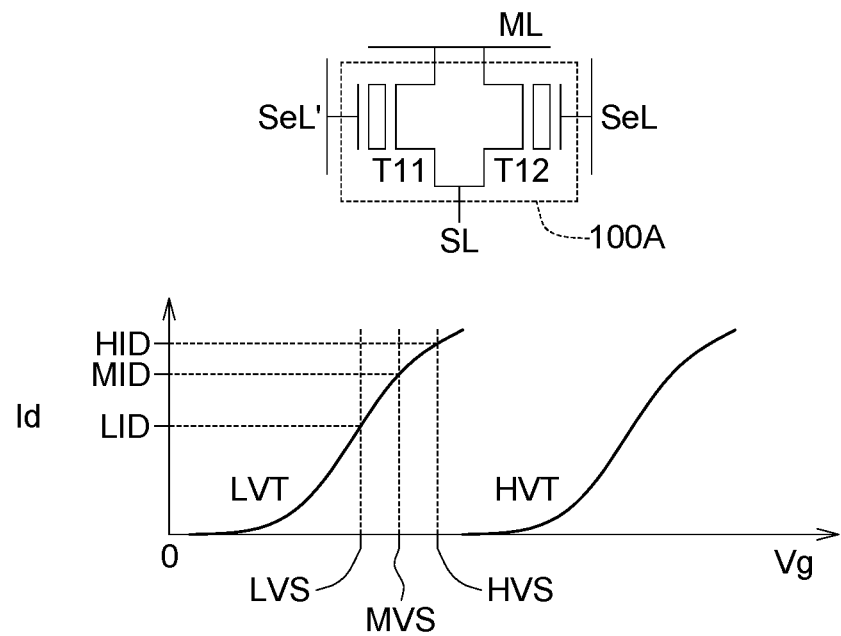
FIG. 1A is a schematic diagram of a TCAM memory cell and the voltage-current relationship curve according to a first example of the first embodiment of the present application.
Figure 1B:
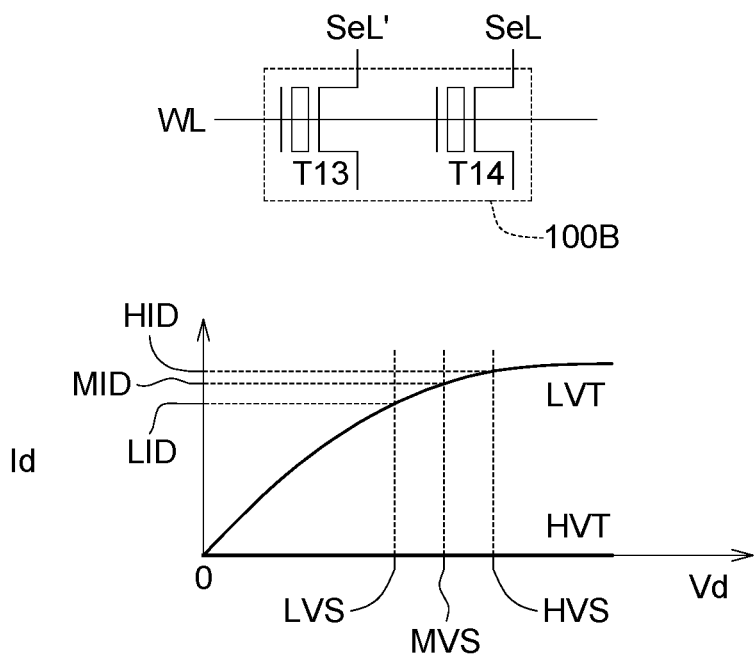
FIG. 1B is a schematic diagram of a TCAM memory cell and the threshold voltage distribution according to a second example of the first embodiment of the present application.

FIG. 1A is a schematic diagram of a TCAM memory cell and the voltage-current relationship curve according to a first example of the first embodiment of the present application. FIG. 1B is a schematic diagram of a TCAM memory cell and the threshold voltage distribution according to a second example of the first embodiment of the present application.

The CAM memory cell 100A according to the first example of the first embodiment of the present application includes two memory cells T11 and T12. The gates of the memory cells T11 and T12 are coupled to the search lines SeL' and SeL for receiving the search voltages. The drains of the memory cells T11 and T12 are coupled to the match line ML. The sources of the memory cells T11 and T12 are coupled to the source line SL.

As shown in the voltage-current relationship curve in FIG. 1A, the threshold voltages of the memory cells T11 and T12 may be set as the low threshold voltage LVT or the high threshold voltage HVT.

The CAM memory cell 100B according to the second example of the first embodiment of the present application includes two memory cells T13 and T14. The gates of the memory cells T13 and T14 are coupled to the word line WL. The drains of the memory cells T13 and T14 are coupled to the search lines SeL' and SeL for receiving the search voltages. The sources of the memory cells T13 and T14 are coupled to the different signal lines.

As shown in the voltage-current relationship curve in FIG. 1B, the threshold voltages of the memory cells T13 and T14 may be set as the low threshold voltage LVT or the high threshold voltage HVT.

In the first embodiment of the present application, encoding of the storage data and the search data are as the following table 3 and the table 4.

TABLE 3

| Storage data | T11 (T13) | T12 (T14) |
|---|---|---|
| 0 | LVT | HVT |
| 1 | HVT | LVT |
| X (Don't care) | HVT | HVT |

TABLE 4

| Search data | SeL' | SeL |
|---|---|---|
| 0_low | 0 | LVS |
| 0_mid | 0 | MVS |
| 0_high | 0 | HVS |
| 1_low | LVS | 0 |
| 1_mid | MVS | 0 |

TABLE 4-continued

| Search data | SeL' | SeL |
|---|---|---|
| 1_high | HVS | 0 |
| WC | 0 | 0 |
| Invalid_low | LVS | LVS |
| Invalid_mid | MVS | MVS |
| Invalid_high | HVS | HVS |

In the table 3, when the threshold voltages of the memory cells T11 (T13) and T12 (14) are LVT and HVT, respectively, storage data of the CAM memory cell 100A or 100B is "0"; when the threshold voltages of the memory cells T11 (T13) and T12 (14) are HVT and LVT, respectively, storage data of the CAM memory cell 100A or 100B is "1"; and when the threshold voltages of the memory cells T11 (T13) and T12 (14) are HVT and HVT, respectively, storage data of the CAM memory cell 100A or 100B is "don't care (X)".

As shown in the table 4, when the voltages on the search line SeL' and SeL are 0V and the low search voltage LVS respectively, the search data is 0_low; when the voltages on the search line SeL' and SeL are 0V and the middle search voltage MVS respectively, the search data is 0_mid; when the voltages on the search line SeL' and SeL are 0V and the high search voltage HVS respectively, the search data is 0_high; when the voltages on the search line SeL' and SeL are the low search voltage LVS and 0V respectively, the search data is 1_low; when the voltages on the search line SeL' and SeL are the middle search voltage MVS and 0V respectively, the search data is 1_mid; when the voltages on the search line SeL' and SeL are the high search voltage HVS and 0V respectively, the search data is 1_high; when the voltages on the search line SeL' and SeL are 0V and 0V respectively, the search data is wildcard (WC); when the voltages on the search line SeL' and SeL are the low search voltage LVS and the low search voltage LVS respectively, the search data is the invalid data Invalid_low; when the voltages on the search line SeL' and SeL are the middle search voltage MVS and the middle search voltage MVS respectively, the search data is the invalid data Invalid_mid; when the voltages on the search line SeL' and SeL are the high search voltage HVS and the high search voltage HVS respectively, the search data is the invalid data Invalid_high. HVS, MVS and LVS are also referred as the reference search voltages.

In the embodiment, "the single-bit multi-level search data" refers to that, for example, the search data 0 is classified as 0_low, 0_mid and 0_high.

In the case that the storage data is 0 (the memory cell T11 (T13) has the low threshold voltage LVT and the memory cell T12 (T14) has the high threshold voltage HVT), when the search data is 0_low (SeL' is 0V and SeL is LVS), the memory cell T11 (T13) does not provide any cell current (because the memory cell T11 (T13) has the low threshold voltage LVT and SeL' is 0V, as shown from the voltage-current relationship curve in FIG. 1A and FIG. 1B, the memory cell T11 (T13) does not provide any cell current); and the memory cell T12 (T14) does not provide any cell current (because the memory cell T12 (T14) has the high threshold voltage HVT and SeL is LVS, as shown from the voltage-current relationship curve in FIG. 1A and FIG. 1B, the memory cell T12 (T14) does not provide any cell current).

Similarly, in the case that the storage data is 0 (the memory cell T11 (T13) has the low threshold voltage LVT and the memory cell T12 (T14) has the high threshold voltage HVT), when the search data is 0_mid (SeL' is 0V and SeL is MVS), the memory cell T11 (T13) does not provide any cell current (because the memory cell T11 (T13) has the low threshold voltage LVT and SeL' is 0V, as shown from the voltage-current relationship curve in FIG. 1A and FIG. 1B, the memory cell T11 (T13) does not provide any cell current); and the memory cell T12 (T14) does not provide any cell current (because the memory cell T12 (T14) has the high threshold voltage HVT and SeL is MVS, as shown from the voltage-current relationship curve in FIG. 1A and FIG. 1B, the memory cell T12 (T14) does not provide any cell current).

Similarly, in the case that the storage data is 0 (the memory cell T11 (T13) has the low threshold voltage LVT and the memory cell T12 (T14) has the high threshold voltage HVT), when the search data is 0_high (SeL' is 0V and SeL is HVS), the memory cell T11 (T13) does not provide any cell current (because the memory cell T11 (T13) has the low threshold voltage LVT and SeL' is 0V, as shown from the voltage-current relationship curve in FIG. 1A and FIG. 1B, the memory cell T11 (T13) does not provide any cell current); and the memory cell T12 (T14) does not provide any cell current (because the memory cell T12 (T14) has the high threshold voltage HVT and SeL is HVS, as shown from the voltage-current relationship curve in FIG. 1A and FIG. 1B, the memory cell T12 (T14) does not provide any cell current).

In the case that the storage data is 0 (the memory cell T11 (T13) has the low threshold voltage LVT and the memory cell T12 (T14) has the high threshold voltage HVT), when the search data is 1_low (SeL' is LVS and SeL is 0V), the memory cell T11 (T13) provides the low cell current LID (because the memory cell T11 (T13) has the low threshold voltage LVT and SeL' is LVS, as shown from the voltage-current relationship curve in FIG. 1A and FIG. 1B, the memory cell T11 (T13) provides the low cell current LID); and the memory cell T12 (T14) does not provide any cell current (because the memory cell T12 (T14) has the high threshold voltage HVT and SeL is 0V, as shown from the voltage-current relationship curve in FIG. 1A and FIG. 1B, the memory cell T12 (T14) does not provide any cell current).

In the case that the storage data is 0 (the memory cell T11 (T13) has the low threshold voltage LVT and the memory cell T12 (T14) has the high threshold voltage HVT), when the search data is 1_mid (SeL' is MVS and SeL is 0V), the memory cell T11 (T13) provides the middle cell current MID (because the memory cell T11 (T13) has the low threshold voltage LVT and SeL' is MVS, as shown from the voltage-current relationship curve in FIG. 1A and FIG. 1B, the memory cell T11 (T13) provides the middle cell current MID); and the memory cell T12 (T14) does not provide any cell current (because the memory cell T12 (T14) has the high threshold voltage HVT and SeL is 0V, as shown from the voltage-current relationship curve in FIG. 1A and FIG. 1B, the memory cell T12 (T14) does not provide any cell current).

In the case that the storage data is 0 (the memory cell T11 (T13) has the low threshold voltage LVT and the memory cell T12 (T14) has the high threshold voltage HVT), when the search data is 1_high (SeL' is HVS and SeL is 0V), the memory cell T11 (T13) provides the high cell current HID (because the memory cell T11 (T13) has the low threshold voltage LVT and SeL' is HVS, as shown from the voltage-current relationship curve in FIG. 1A and FIG. 1B, the memory cell T11 (T13) provides the high cell current HID); and the memory cell T12 (T14) does not provide any cell current (because the memory cell T12 (T14) has the high threshold voltage HVT and SeL is 0V, as shown from the voltage-current relationship curve in FIG. 1A and FIG. 1B, the memory cell T12 (T14) does not provide any cell current).

Thus, the table 5 shows the search result in the first example and the second example of the first embodiment of the application.

TABLE 5

| | Storage data 0 | Storage data 1 | Storage data X |
|---|---|---|---|
| Search data 0_low | Match (no current) | Mismatch (low current) | Match (no current) |
| Search data 0_mid | Match (no current) | Mismatch (middle current) | Match (no current) |
| Search data 0_high | Match (no current) | Mismatch (high current) | Match (no current) |
| Search data 1_low | Mismatch (low current) | Match (no current) | Match (no current) |
| Search data 1_mid | Mismatch (middle current) | Match (no current) | Match (no current) |
| Search data 1_high | Mismatch (high current) | Match (no current) | Match (no current) |
| Search data WC | Match (no current) | Match (no current) | Match (no current) |
| Search data Invalid_low | Mismatch (low current) | Mismatch (low current) | Match (no current) |
| Search data Invalid_mid | Mismatch (middle current) | Mismatch (middle current) | Match (no current) |
| Search data Invalid_high | Mismatch (high current) | Mismatch (high current) | Match (no current) |

In the first embodiment, when the search result is matched, the CAM memory cell does not provide any current. When the search is mismatched, based on the mismatch degree, the CAM memory cell provides high, middle or low current.

In the first embodiment, the mismatch degree between the storage data 1 and the search data 0_low is smaller than the mismatch degree between the storage data 1 and the search data 0_mid, thus the mismatched low current is smaller than the mismatched middle current.

In the first embodiment, by adjusting the search voltages LVS, MVS and HVS of the search data, even when the CAM memory cell is a single-bit memory cell, different levels of mismatched currents are generated for representing difference in similarity degree.

The first embodiment has more possible examples. In other possible examples, the storage data is shown in the table 6 (the same as the table 3) and the search data is shown in the table 7.

TABLE 6

| storage data | T11 (T13) | T12 (T14) |
|---|---|---|
| 0 | LVT | HVT |
| 1 | HVT | LVT |
| X (Don't care) | HVT | HVT |

TABLE 7

| Search data | SeL' | SeL |
|---|---|---|
| 0_low | 0 | LVS |
| 0_mid1 | 0 | MVS1 |
| 0_mid2 | 0 | MVS2 |
| ... | ... | ... |
| 0_high | 0 | HVS |
| 1_low | LVS | 0 |

TABLE 7-continued

| Search data | SeL' | SeL |
|---|---|---|
| 1_mid1 | MVS1 | 0 |
| 1_mid2 | MVS2 | 0 |
| ... | ... | ... |
| 1_high | HVS | 0 |
| WC | 0 | 0 |
| Invalid_low | LVS | LVS |
| Invalid_mid1 | MVS1 | MVS1 |
| Invalid_mid2 | MVS2 | MVS2 |
| ... | ... | ... |
| Invalid_high | HVS | HVS |

In table 7, the search data may be 0_low, 0_mid1, 0_mid2, . . . , 0_high and the search voltages may be LVS, MVS1, MVS2, . . . , HVS.

Table 8 shows search result.

TABLE 8

| | storage data 0 | storage data 1 | storage data X |
|---|---|---|---|
| search data 0_low | Match (no current) | Mismatch (low current) | Match (no current) |
| search data 0_mid1 | Match (no current) | Mismatch (middle current 1) | Match (no current) |
| search data 0_mid2 | Match (no current) | Mismatch (middle current 2) | Match (no current) |
| ... | ... | ... | ... |
| search data 0_high | Match (no current) | Mismatch (high current) | Match (no current) |
| search data 1_low | Mismatch (low current) | Match (no current) | Match (no current) |
| search data 1_mid1 | Mismatch (middle current 1) | Match (no current) | Match (no current) |
| search data 1_mid2 | Mismatch (middle current 2) | Match (no current) | Match (no current) |
| ... | ... | ... | ... |
| search data 1_high | Mismatch (high current) | Match (no current) | Match (no current) |
| search data WC | Match (no current) | Match (no current) | Match (no current) |
| search data Invalid_low | Mismatch (low current) | Mismatch (low current) | Match (no current) |
| search data Invalid_mid1 | Mismatch (middle current 1) | Mismatch (middle current 1) | Match (no current) |
| search data Invalid_mid2 | Mismatch (middle current 2) | Mismatch (middle current 2) | Match (no current) |
| ... | ... | ... | ... |
| search data Invalid_high | Mismatch (high current) | Mismatch (high current) | Match (no current) |

Second Embodiment

Figure 2A:
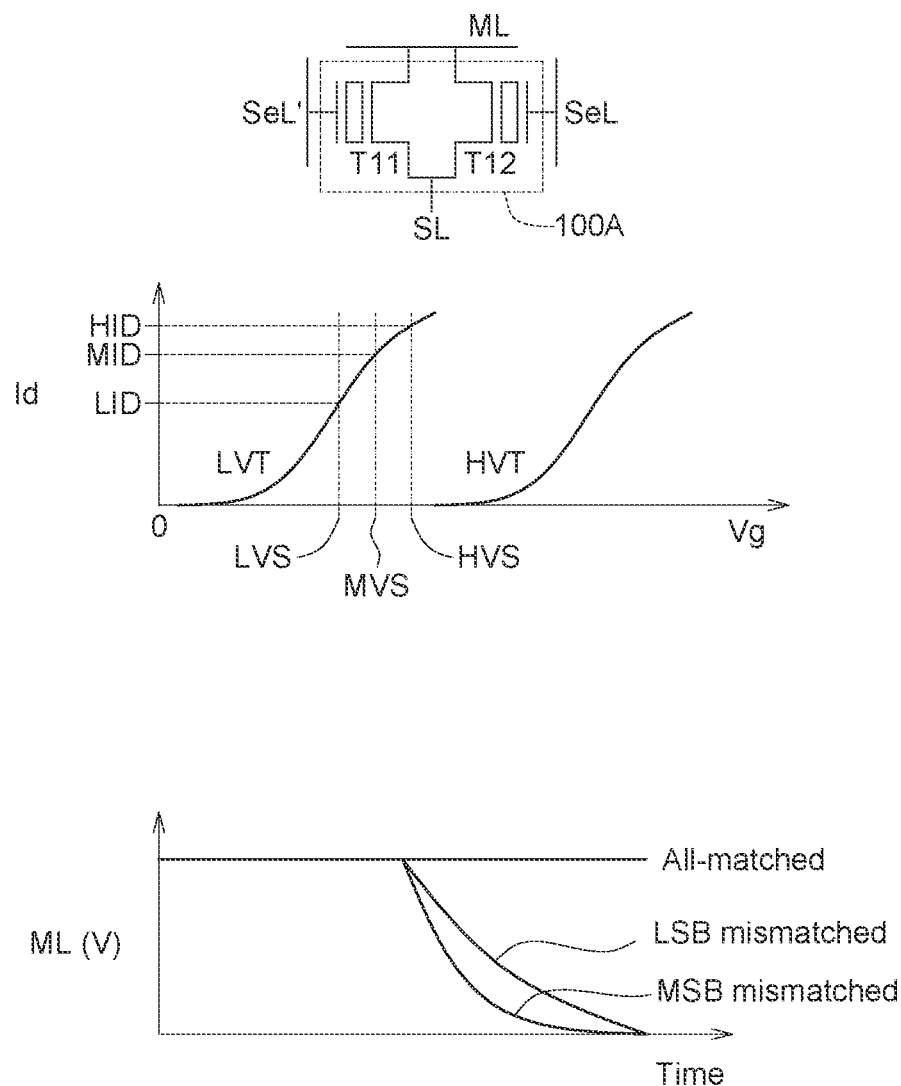
FIG. 2A is a schematic diagram of a TCAM memory cell and the voltage-current relationship curve according to the second embodiment of the present application.
Figure 2B:
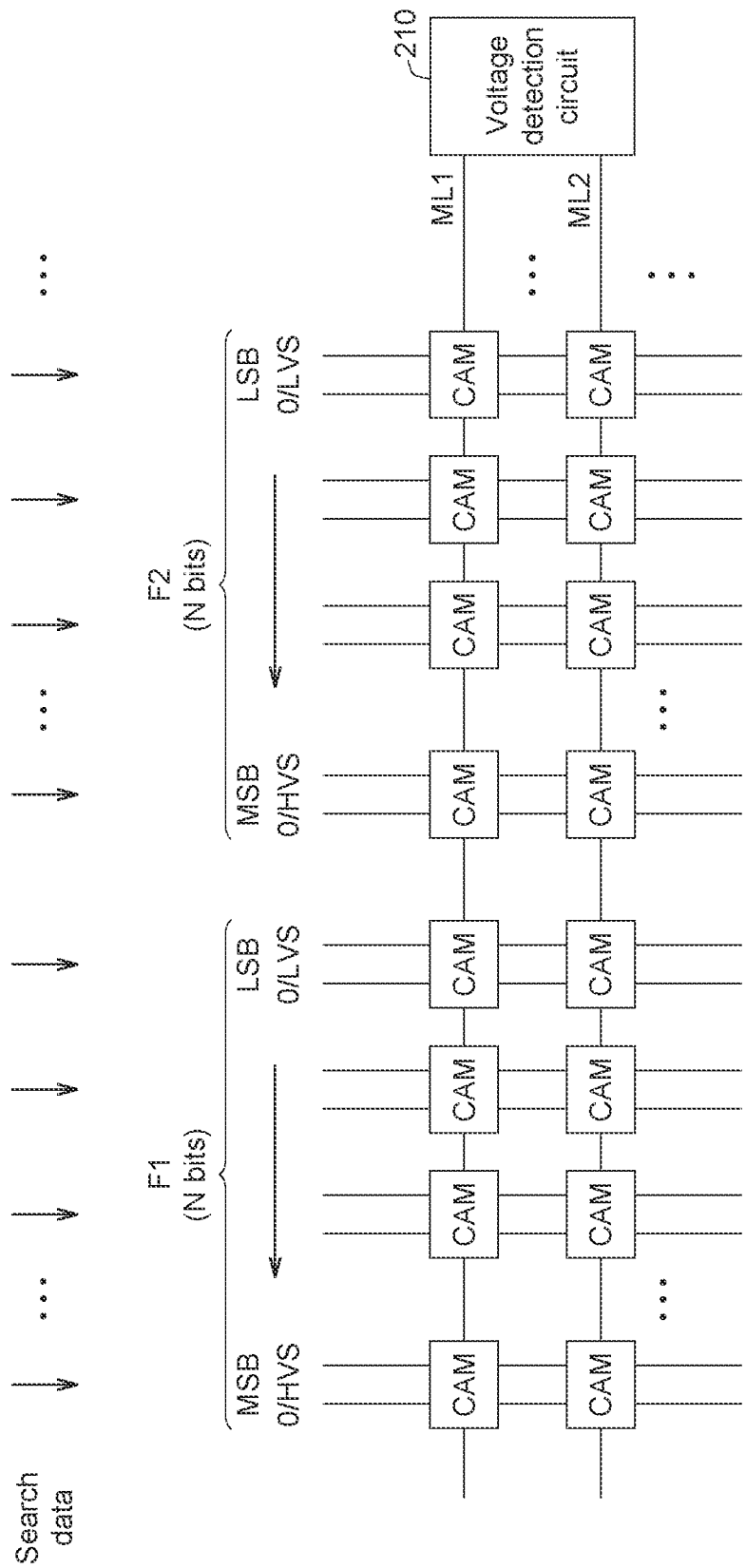
FIG. 2B is an operation diagram of the TCAM memory device according to the second embodiment of the present application.

FIG. 2A is a schematic diagram of a TCAM memory cell and the voltage-current relationship curve according to the second embodiment of the present application. FIG. 2B is an operation diagram of the TCAM memory device according to the second embodiment of the present application.

The second embodiment of the present application may be used in weighting each bit of the search data.

In search operation, taking the search data F1 and F2 as an example. The search data F1 and F2 both have N bits (N being a natural number). MSB (most significant bit) of search data F1 and F2 may be encoded as 0V or HVS (as the first embodiment) and LSB (least significant bit) of the search data F1 and F2 may be encoded as 0V or LVS (as the first embodiment). As for the middle significant bits between the MSB and the LSB of the search data F1 and F2 may be encoded as 0V or high MSV to 0V or low MSV.

As shown in FIG. 2A, when the match result indicates all-matched, the voltage detection circuit 210 (also referred as an electrical characteristic detection circuit) detects that the match line voltage on the match line ML1 and/or ML2 is not discharged; when the match result indicates MSB-mismatched, the voltage detection circuit 210 detects that the match line voltage on the match line ML1 and/or ML2 is fast discharged; and when the match result indicates LSB-mismatched, the voltage detection circuit 210 detects that the match line voltage on the match line ML1 and/or ML2 is slowly discharged.

Third Embodiment

Figure 3A:
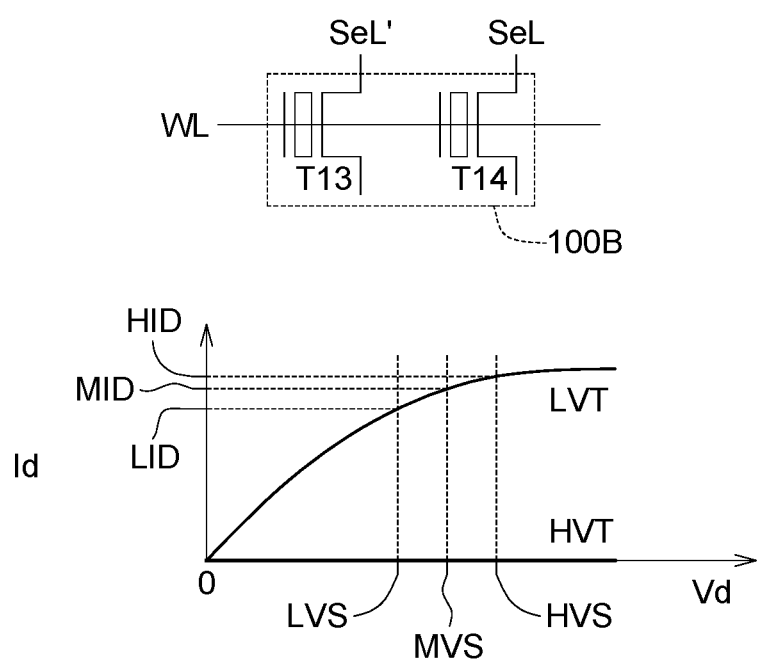
FIG. 3A is a schematic diagram of a TCAM memory cell and the voltage-current relationship curve according to the third embodiment of the present application.
Figure 3B:
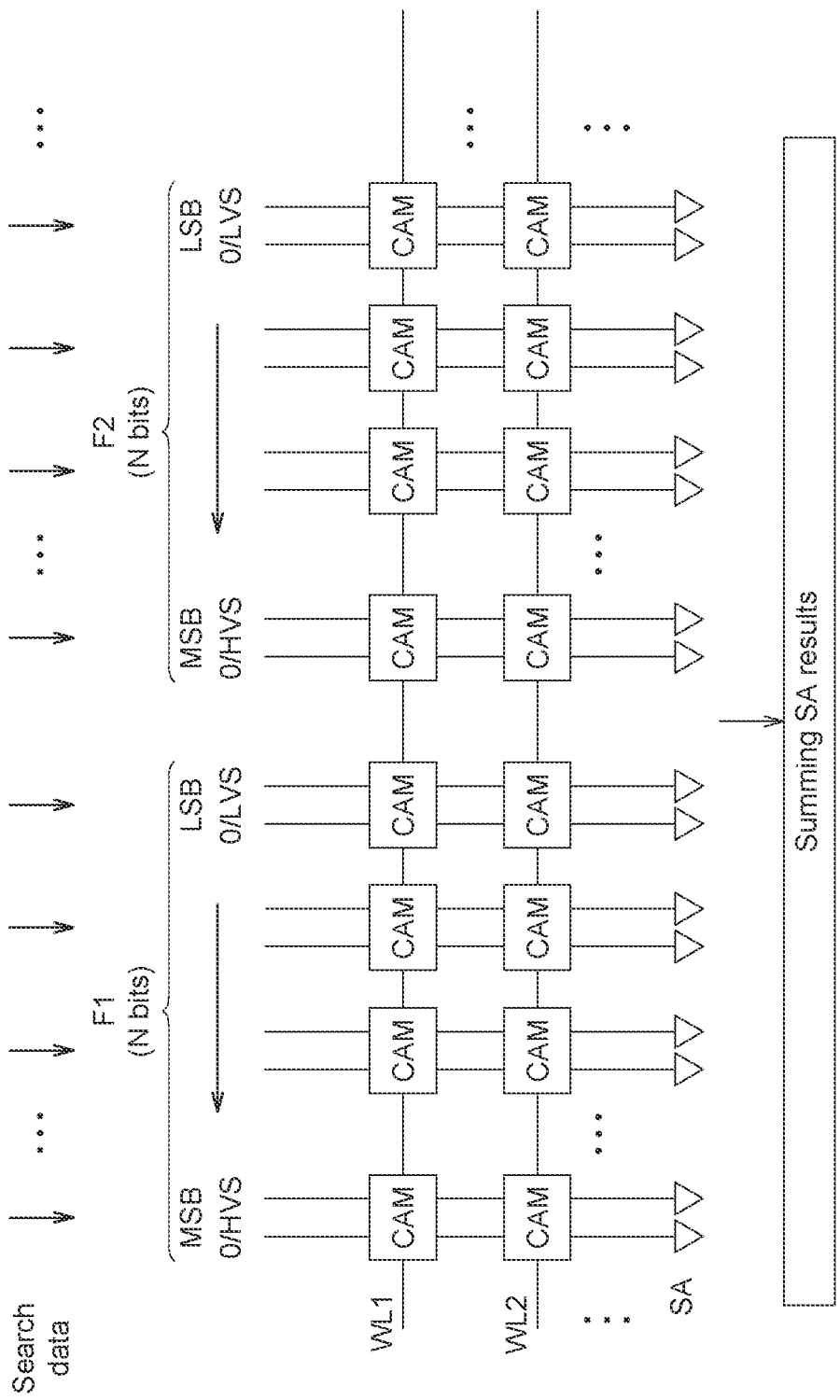
FIG. 3B is an operation diagram of the TCAM memory device according to the third embodiment of the present application.

FIG. 3A is a schematic diagram of a TCAM memory cell and the voltage-current relationship curve according to the third embodiment of the present application. FIG. 3B is an operation diagram of the TCAM memory device according to the third embodiment of the present application.

The third embodiment of the present application may be used in weighting each bit of the search data.

In search operation, taking the search data F1 and F2 as an example. The search data F1 and F2 both have N bits (N being a natural number). MSB (most significant bit) of the search data F1 and F2 may be encoded as 0V or HVS (as the first embodiment) and LSB (least significant bit) of the search data F1 and F2 may be encoded as 0V or LVS (as the first embodiment). As for the middle significant bits between the MSB and the LSB of the search data F1 and F2 may be encoded as 0V or high MSV to 0V or low MSV.

As shown in FIG. 3B, in searching operations, the cell currents from the CAM memory cells flow into the sensing amplifiers SA (also referred as the electrical characteristic detection circuit) coupled to the CAM memory cells; and the sensing results of the sensing amplifiers SA are summed to generate the search result.

When the match result indicates all-matched, the sensing amplifier SA detects no any cell current; when the match result indicates MSB-mismatched, the corresponding CAM memory cell provides high mismatched current and thus the sensing amplifier SA senses high cell current; and when the match result indicates LSB-mismatched, the corresponding CAM memory cell provides low mismatched current and thus the sensing amplifier SA senses low cell current. The summation of the sensing results of the sensing amplifiers SA may be used to determine whether the search result is all-matched, MSB-mismatched or LSB-mismatched.

Fourth Embodiment

Figure 4A:
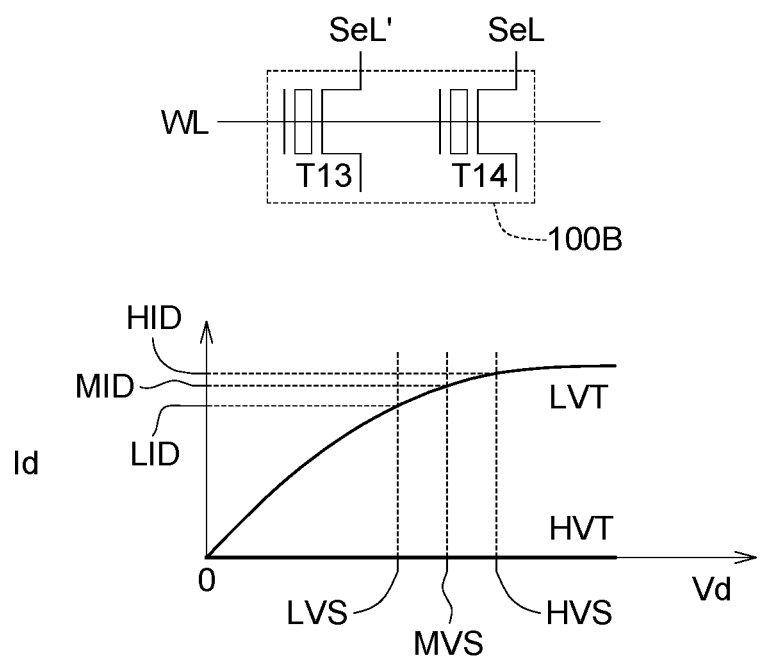
FIG. 4A is a schematic diagram of a TCAM memory cell and the voltage-current relationship curve according to the fourth embodiment of the present application.
Figure 4B:
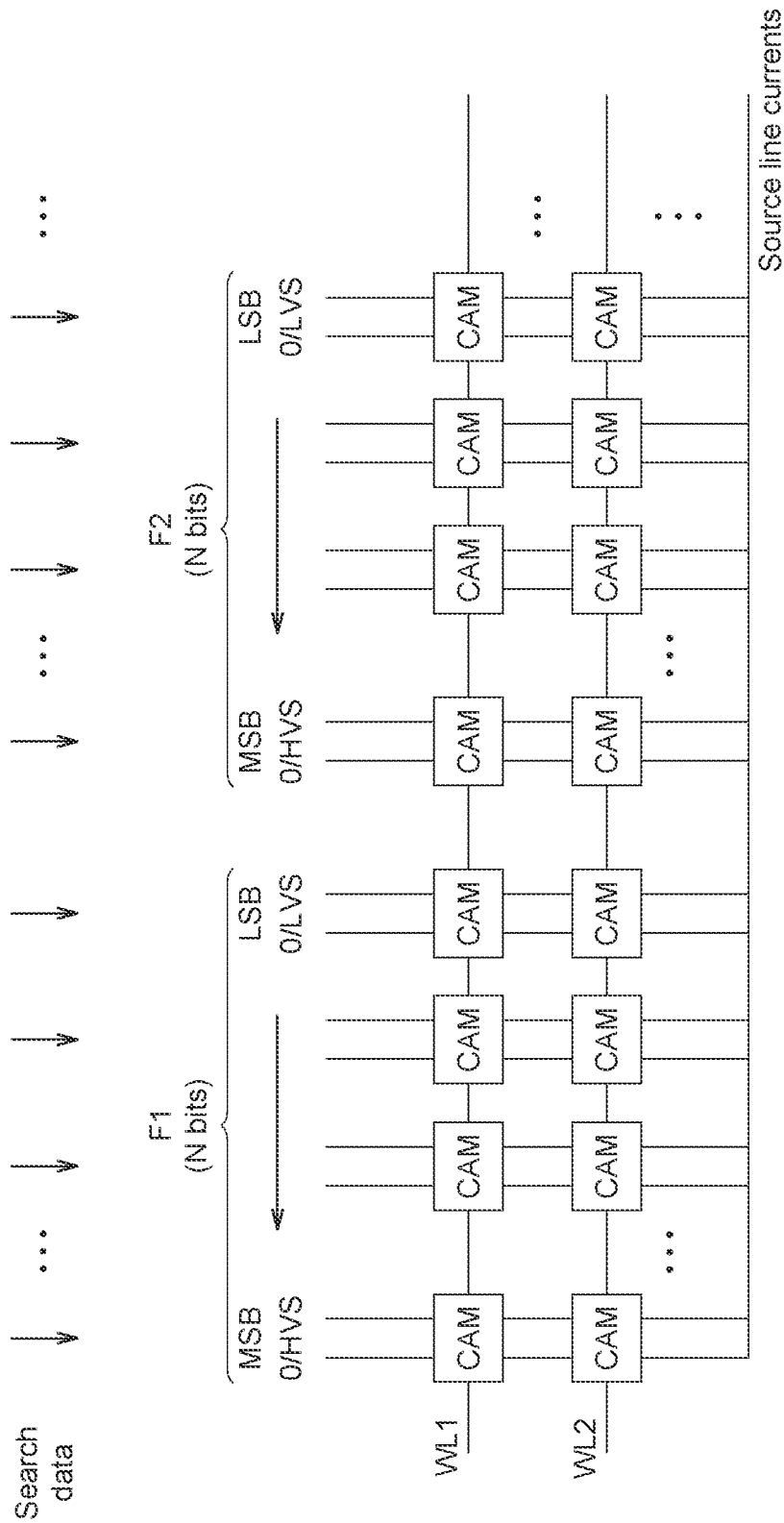
FIG. 4B is an operation diagram of the TCAM memory device according to the fourth embodiment of the present application.

FIG. 4A is a schematic diagram of a TCAM memory cell and the voltage-current relationship curve according to the fourth embodiment of the present application. FIG. 4B is an operation diagram of the TCAM memory device according to the fourth embodiment of the present application.

The fourth embodiment of the present application may be used in weighting each bit of the search data.

In search operation, taking the search data F1 and F2 as an example. The search data F1 and F2 both have N bits (N being a natural number). MSB (most significant bit) of the search data F1 and F2 may be encoded as 0V or HVS (as the first embodiment) and LSB (least significant bit) of the search data F1 and F2 may be encoded as 0V or LVS (as the first embodiment). As for the middle significant bits between the MSB and the LSB of the search data F1 and F2 may be encoded as 0V or high MSV to 0V or low MSV.

As shown in FIG. 4B, in searching operations, the cell currents from the CAM memory cells flow into the source lines; and the currents on the source lines are summed to generate the search result.

When the match result indicates all-matched, no any cell current is detected; when the match result indicates MSB-mismatched, the corresponding CAM memory cell provides high mismatched current and thus the sensing amplifier SA senses high cell current; and when the match result indicates LSB-mismatched, the corresponding CAM memory cell provides low mismatched current and thus the sensing amplifier SA senses low cell current. The summation of the currents on the source lines may be used to determine whether the search result is all-matched, MSB-mismatched or LSB-mismatched.

Fifth Embodiment

Figure 5A:
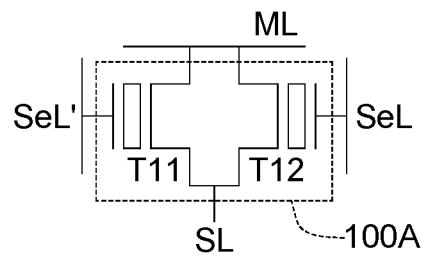
FIG. 5A is a schematic diagram of a TCAM memory cell and the voltage-current relationship curve according to a first example of the fifth embodiment of the present application.
Figure 5A:
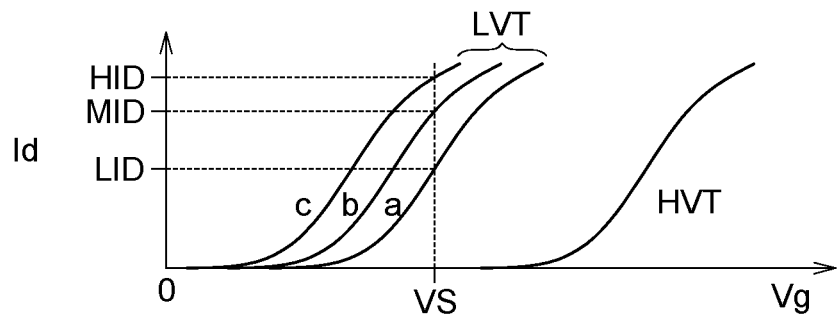
Figure 5B:
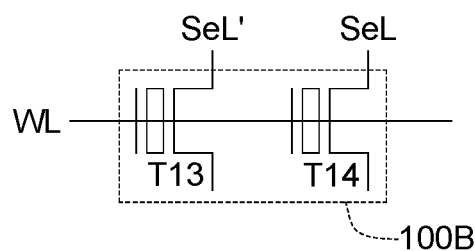
FIG. 5B is a schematic diagram of a TCAM memory cell and the threshold voltage distribution according to a second example of the fifth embodiment of the present application.
Figure 5B:
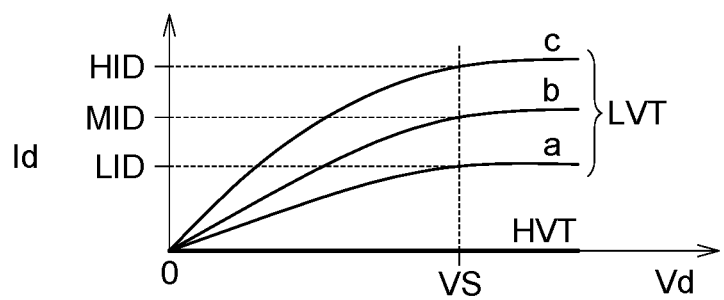

FIG. 5A is a schematic diagram of a TCAM memory cell and the voltage-current relationship curve according to a first example of the fifth embodiment of the present application. FIG. 5B is a schematic diagram of a TCAM memory cell and the threshold voltage distribution according to a second example of the fifth embodiment of the present application.

The CAM memory cell 100A and 100B according to the fifth embodiment of the present application has the same or similar circuit structure with the CAM memory cell 100A and 100B according to the first embodiment and thus the details are omitted here.

As shown in the voltage-current relationship curve in FIG. 5A or 5B, the threshold voltages of the memory cells T11 and T12 (T13 and T14) may be set as the low threshold voltage LVT or the high threshold voltage HVT. wherein the low threshold voltage LVT has three levels LVTa, LVTb and LVTc, LVTa>LVTb>LVTc. LVTa, LVTb and LVTc are also referred as the reference threshold voltages.

In the fifth embodiment of the present application, encoding of the storage data and the search data are as the following table 9 and the table 10.

TABLE 9

| Storage data | T11 (T13) | T12 (T14) |
|---|---|---|
| 0_low | LVTa | HVT |
| 0_mid | LVTb | HVT |
| 0_high | LVTc | HVT |
| 1_low | HVT | LVTa |
| 1_mid | HVT | LVTb |
| 1_high | HVT | LVTc |
| X (Don't care) | HVT | HVT |

TABLE 10

| Search data | SeL' | SeL |
|---|---|---|
| 0 | 0 | VS |
| 1 | VS | 0 |
| WC | 0 | 0 |
| Invalid | VS | VS |

In the table 9, when the threshold voltages of the memory cells T11 (T13) and T12 (14) are LVTa and HVT, respectively, storage data of the CAM memory cell 100A or 100B is "0_low"; when the threshold voltages of the memory cells T11 (T13) and T12 (14) are LVTb and HVT, respectively, storage data of the CAM memory cell 100A or 100B is "0_mid"; when the threshold voltages of the memory cells T11 (T13) and T12 (14) are LVTc and HVT, respectively, storage data of the CAM memory cell 100A or 100B is "0_high"; when the threshold voltages of the memory cells T11 (T13) and T12 (14) are HVT and LVTa, respectively, storage data of the CAM memory cell 100A or 100B is "1_low"; when the threshold voltages of the memory cells T11 (T13) and T12 (14) are HVT and LVTb, respectively, storage data of the CAM memory cell 100A or 100B is "1_mid"; when the threshold voltages of the memory cells T11 (T13) and T12 (14) are HVT and LVTc, respectively, storage data of the CAM memory cell 100A or 100B is "1_high"; and when the threshold voltages of the memory cells T11 (T13) and T12 (14) are HVT and HVT, respectively, storage data of the CAM memory cell 100A or 100B is "X (don't care)".

As shown in the table 10, when the voltages on the search line SeL' and SeL are 0V and the search voltage VS respectively, the search data is 0; when the voltages on the search line SeL' and SeL are the search voltage VS and 0V respectively, the search data is 1; when the voltages on the search line SeL' and SeL are 0V and 0V respectively, the search data is wildcard (WC); when the voltages on the search line SeL' and SeL are the search voltage VS and the search voltage VS respectively, the search data is the invalid data Invalid.

In the embodiment, "the single-bit multi-level storage data" refers to that, for example, the storage data 0 is classified as 0_low, 0_mid and 0_high.

In the case that the storage data is 0_low (the memory cell T11 (T13) has the low threshold voltage LVTa and the memory cell T12 (T14) has the high threshold voltage HVT), when the search data is 0 (SeL' is 0V and SeL is VS), the memory cell T11 (T13) does not provide any cell current (because the memory cell T11 (T13) has the low threshold voltage LVTa and SeL' is 0V, as shown from the voltage-current relationship curve in FIG. 5A and FIG. 5B, the memory cell T11 (T13) does not provide any cell current); and the memory cell T12 (T14) does not provide any cell current (because the memory cell T12 (T14) has the high threshold voltage HVT and SeL is VS, as shown from the voltage-current relationship curve in FIG. 5A and FIG. 5B, the memory cell T12 (T14) does not provide any cell current).

In the case that the storage data is 0_low (the memory cell T11 (T13) has the low threshold voltage LVTa and the memory cell T12 (T14) has the high threshold voltage HVT), when the search data is 1 (SeL' is VS and SeL is 0V), the memory cell T11 (T13) provides the low cell current LID (because the memory cell T11 (T13) has the low threshold voltage LVTa and SeL' is VS, as shown from the voltage-current relationship curve in FIG. 5A and FIG. 5B, the memory cell T11 (T13) provides the low cell current LID); and the memory cell T12 (T14) does not provide any cell current (because the memory cell T12 (T14) has the high threshold voltage HVT and SeL is 0V, as shown from the voltage-current relationship curve in FIG. 5A and FIG. 5B, the memory cell T12 (T14) does not provide any cell current).

Thus, the table 11 shows the search result in the first example and the second example of the fifth embodiment of the application.

TABLE 11

| | Search data 0 | Search data 1 | Search data WC | Search data Invalid |
|---|---|---|---|---|
| Storage data 0_low | Matched (no current) | Mismatched (low current) | Matched (no current) | Mismatched (low current) |
| Storage data 0_mid | Matched (no current) | Mismatched (middle current) | Matched (no current) | Mismatched (middle current) |
| Storage data 0_high | Matched (no current) | Mismatched (high current) | Matched (no current) | Mismatched (high current) |
| Storage data 1_low | Mismatched (low current) | Matched (no current) | Matched (no current) | Mismatched (low current) |
| Storage data 1_mid | Mismatched (middle current) | Matched (no current) | Matched (no current) | Mismatched (middle current) |
| Storage data 1_high | Mismatched (high current) | Matched (no current) | Matched (no current) | Mismatched (high current) |
| Storage data X | Matched (no current) | Matched (no current) | Matched (no current) | Matched (no current) |

In the fifth embodiment, when the search result is matched, the CAM memory cell does not provide any current. When the search is mismatched, based on the mismatch degree, the CAM memory cell provides high, middle or low current.

In the fifth embodiment, by adjusting the threshold voltage of the CAM memory cell (i.e. the low threshold voltage has three levels LVTa, LVTb and LVTc), even when the search data is a single-bit single-level search data, different levels of mismatched currents are generated for representing difference in similarity degree.

The fifth embodiment has more possible examples. In other possible examples, the storage data is shown in the table 12 and the search data is shown in the table 13.

TABLE 12

| Storage data | T11 (T13) | T12 (T14) |
|---|---|---|
| 0_low | LVTa | HVT |
| 0_mid1 | LVTb1 | HVT |
| 0_mid2 | LVTb2 | HVT |
| ... | ... | ... |
| 0_high | LVTc | HVT |
| 1_low | HVT | LVTa |
| 1_mid1 | HVT | LVTb1 |
| 1_mid2 | HVT | LVTb2 |
| ... | ... | ... |
| 1_high | HVT | LVTc |
| X (Don't care) | HVT | HVT |

TABLE 13

| Search data | SeL' | SeL |
|---|---|---|
| 0 | 0 | VS |
| 1 | VS | 0 |
| WC | 0 | 0 |
| Invalid | VS | VS |

In table 12, the storage data may be 0_low, 0_mid1, 0_mid2, ..., 0_high when the memory cell T11 (T12) has the low threshold voltage LVTa, LVTb1, LVTb2, ... or LVTc and the memory cell T13 (T14) has the high threshold voltage HVT. the storage data may be 1_low, 1_mid1, 1_mid2, ... 1_high when the memory cell T11 (T12) has the high threshold voltage HVT and the memory cell T13 (T14)

has the low threshold voltage LVTa, LVTb or LVTc, wherein LVTa>LVTb1>LVTb2> . . . >LVTc.

Table 14 shows search result.

TABLE 14

| | Search data 0 | Search data 1 | Search data WC | Search data Invalid |
|---|---|---|---|---|
| Storage data 0_low | Matched (no current) | Mismatched (low current) | Matched (no current) | Mismatched (low current) |
| Storage data 0_mid1 | Matched (no current) | Mismatched (middle current 1) | Matched (no current) | Mismatched (middle current 1) |
| Storage data 0_mid2 | Matched (no current) | Mismatched (middle current 2) | Matched (no current) | Mismatched (middle current 2) |
| . . . | . . . | . . . | . . . | . . . |
| Storage data 0_high | Matched (no current) | Mismatched (high current) | Matched (no current) | Mismatched (high current) |
| Storage data 1_low | Mismatched (low current) | Matched (no current) | Matched (no current) | Mismatched (low current) |
| Storage data 1_mid1 | Mismatched (middle current 1) | Matched (no current) | Matched (no current) | Mismatched (middle current 1) |
| Storage data 1_mid2 | Mismatched (middle current 2) | Matched (no current) | Matched (no current) | Mismatched (middle current 2) |
| . . . | . . . | . . . | . . . | . . . |
| Storage data 1_high | Mismatched (high current) | Matched (no current) | Matched (no current) | Mismatched (high current) |
| Storage data X | Matched (no current) | Matched (no current) | Matched (no current) | Matched (no current) |

In table 14, the mismatched high current is higher than the mismatched middle current 1, the mismatched middle current 1 is higher than the mismatched middle current 2, and the mismatched middle current 2 is higher than the mismatched low current.

Sixth Embodiment

Figure 6A:
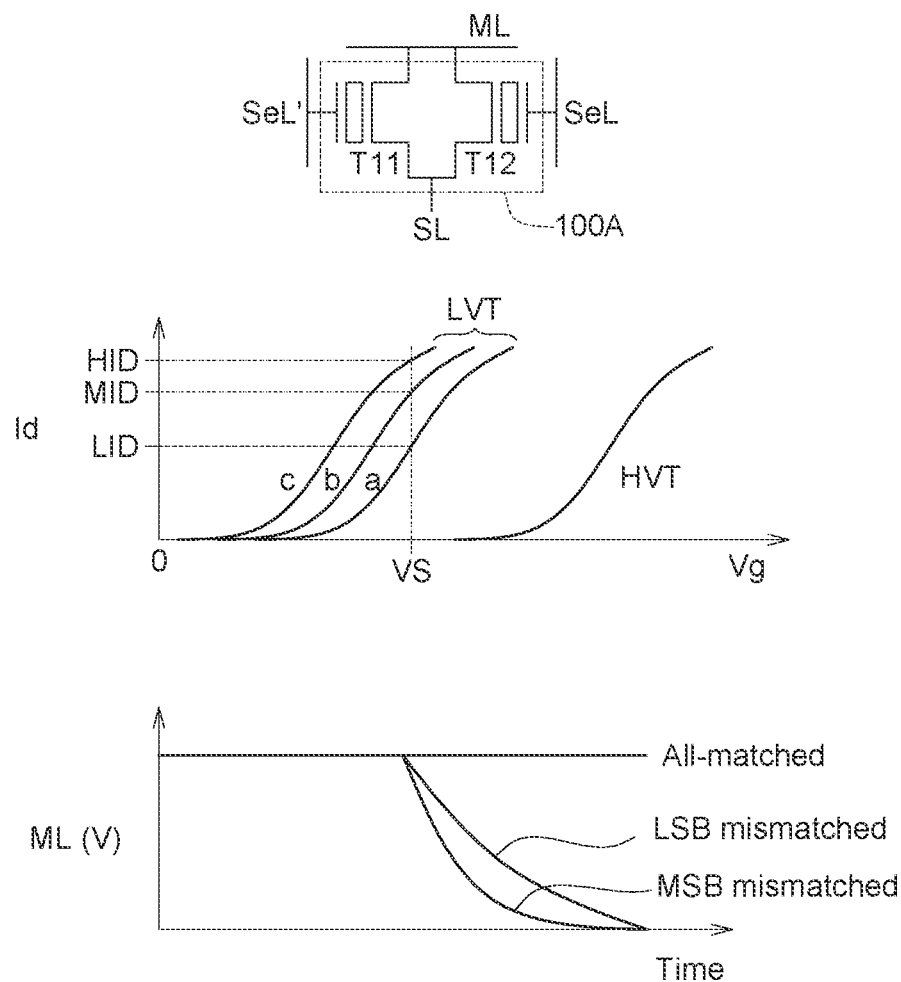
FIG. 6A is a schematic diagram of a TCAM memory cell and the voltage-current relationship curve according to the sixth embodiment of the present application.
Figure 6B:
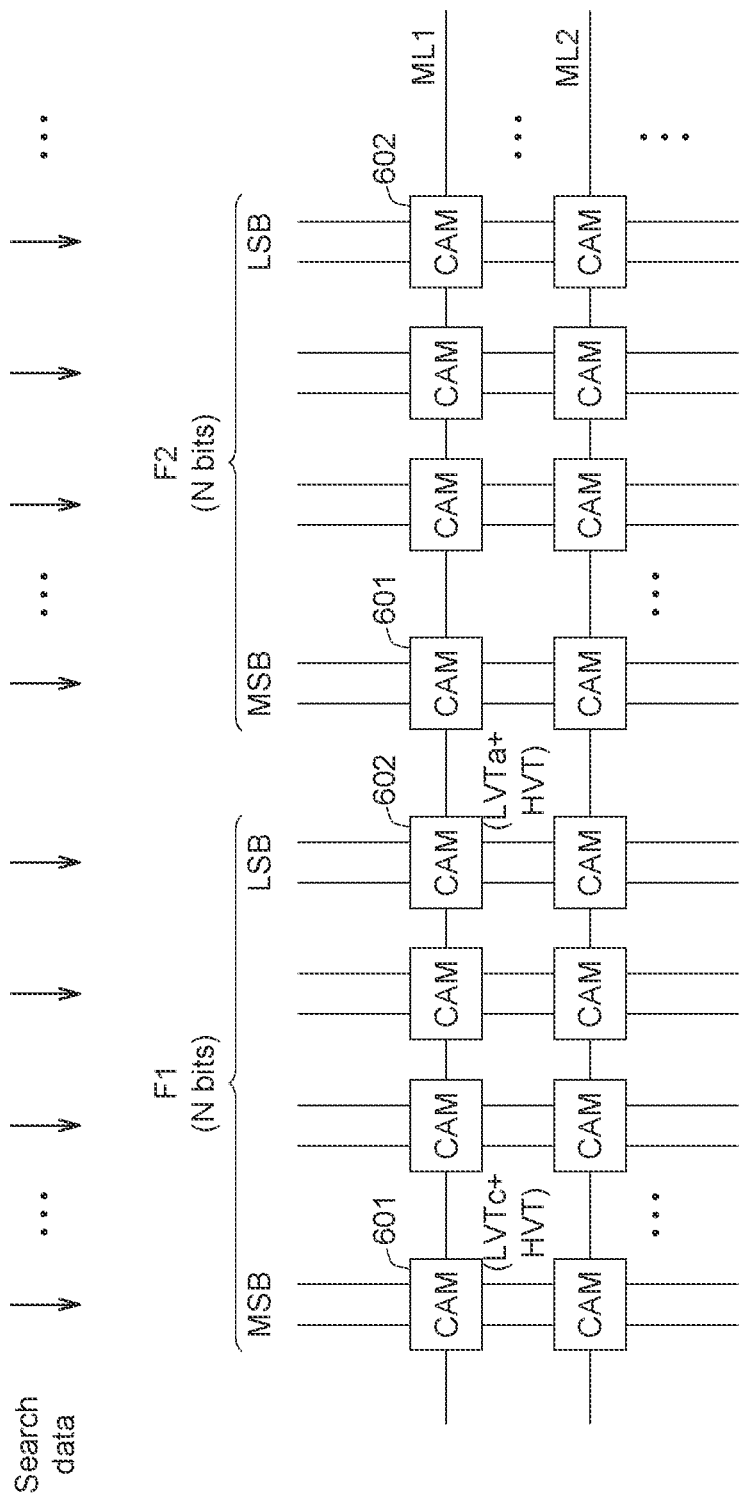
FIG. 6B is an operation diagram of the TCAM memory device according to the sixth embodiment of the present application.

FIG. 6A is a schematic diagram of a TCAM memory cell and the voltage-current relationship curve according to the sixth embodiment of the present application. FIG. 6B is an operation diagram of the TCAM memory device according to the sixth embodiment of the present application.

The sixth embodiment of the present application may be used in weighting each bit of the search data.

In search operation, taking the search data F1 and F2 as an example. The search data F1 and F2 both have N bits (N being a natural number). MSB (most significant bit) of the search data F1 and F2 may be encoded as 0V or VS (as the fifth embodiment) and LSB (least significant bit) of the search data F1 and F2 may be encoded as 0V or VS (as the fifth embodiment). As for the middle significant bits between the MSB and the LSB of the search data F1 and F2 may be encoded as 0V or VS to 0V or VS.

Further, the CAM memory cell 601 corresponding to the MSB of the search data F1 and F2 may be encoded to have the low threshold voltage LVTc (T11) and the high threshold voltage HVT (T12); the CAM memory cell 602 corresponding to the LSB of the search data F1 and F2 may be encoded to have the low threshold voltage LVTa (T11) and the high threshold voltage HVT (T12); and other CAM memory cells located between the CAM memory cell 602 and the CAM memory cell 601 may be encoded to have the middle threshold voltage LVTb (or LVTb1, LVTb2 . . . ) (T11) and the high threshold voltage HVT (T12).

In FIG. 6B, when the MSB of the search data F1 and F2 is not matched with the storage data of the CAM memory cell 601, MSB-mismatched is occurred; and when the LSB of the search data F1 and F2 is not matched with the storage data of the CAM memory cell 602, LSB-mismatched is occurred.

As shown in FIG. 6A, when the match result indicates all-matched, the match line voltage on the match line ML1 and/or ML2 is not discharged; when the match result indicates MSB-mismatched, the match line voltage on the match line ML1 and/or ML2 is fast discharged; and when the match result indicates LSB-mismatched, the match line voltage on the match line ML1 and/or ML2 is slowly discharged.

Seventh Embodiment

Figure 7A:
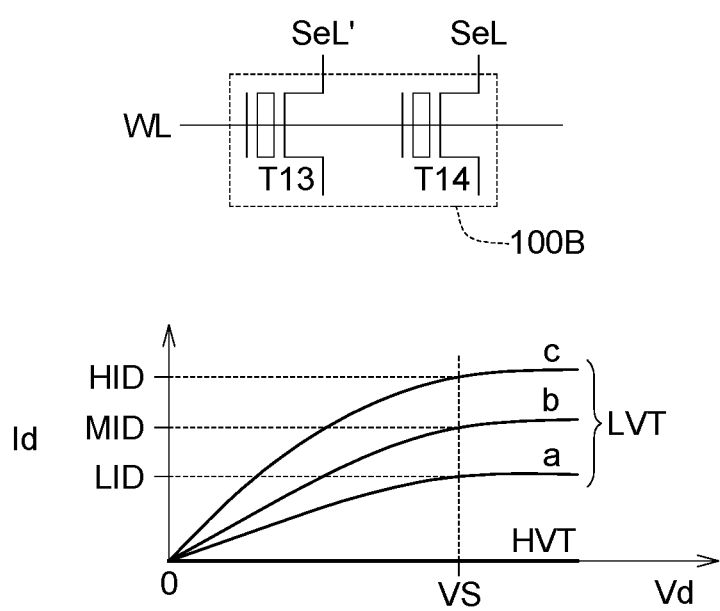
FIG. 7A is a schematic diagram of a TCAM memory cell and the voltage-current relationship curve according to the seventh embodiment of the present application.
Figure 7B:
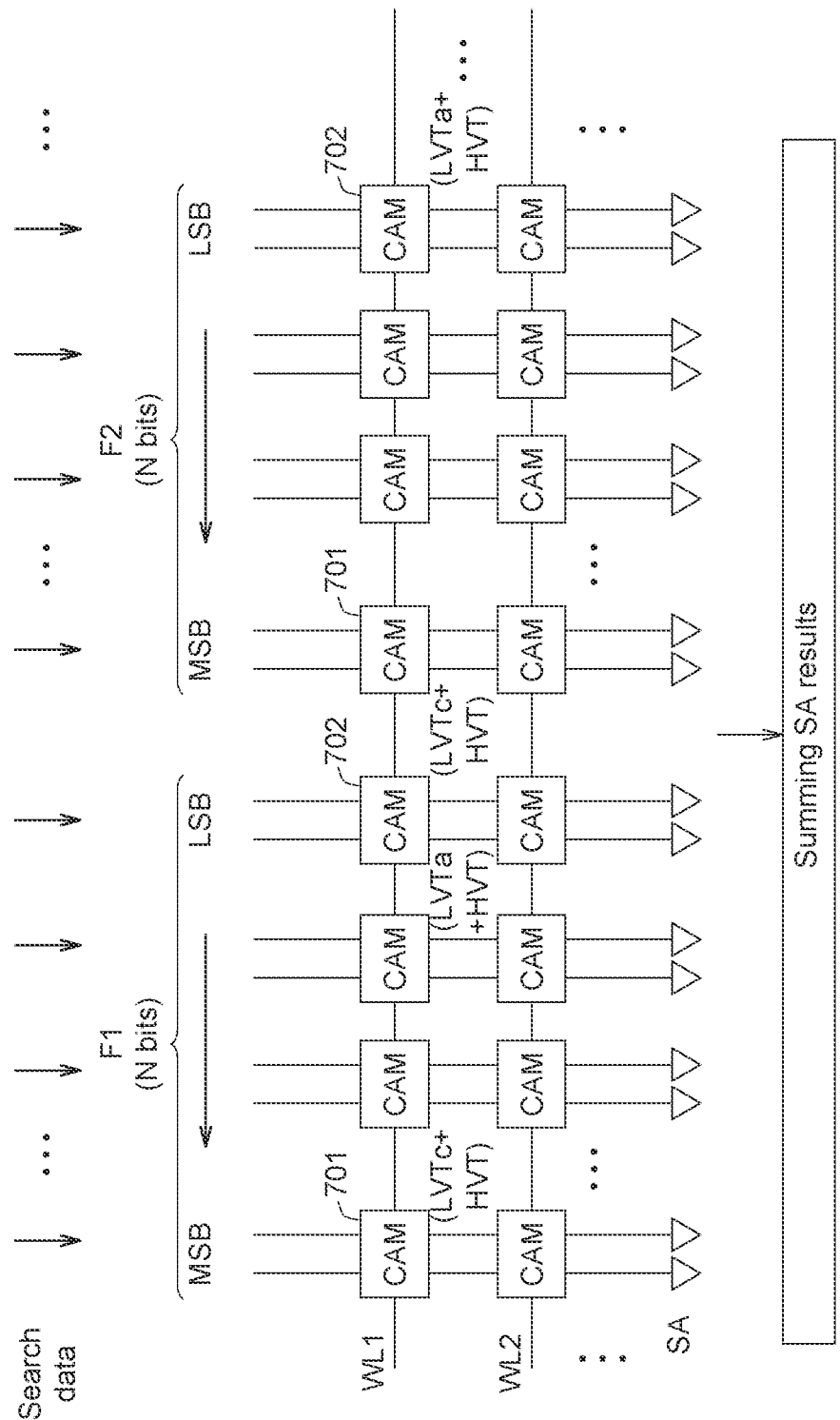
FIG. 7B is an operation diagram of the TCAM memory device according to the seventh embodiment of the present application.

FIG. 7A is a schematic diagram of a TCAM memory cell and the voltage-current relationship curve according to the seventh embodiment of the present application. FIG. 7B is an operation diagram of the TCAM memory device according to the seventh embodiment of the present application.

The seventh embodiment of the present application may be used in weighting each bit of the search data.

In search operation, taking the search data F1 and F2 as an example. The search data F1 and F2 both have N bits (N being a natural number). MSB (most significant bit) of the search data F1 and F2 may be encoded as 0V or VS (as the fifth embodiment) and LSB (least significant bit) of the search data F1 and F2 may be encoded as 0V or VS (as the fifth embodiment). As for the middle significant bits between the MSB and the LSB of the search data F1 and F2 may be encoded as 0V or VS to 0V or VS.

Further, the CAM memory cell 701 corresponding to the MSB of the search data F1 and F2 may be encoded to have the low threshold voltage LVTc (T13) and the high threshold voltage HVT (T14); the CAM memory cell 702 corresponding to the LSB of the search data F1 and F2 may be encoded to have the low threshold voltage LVTa (T13) and the high threshold voltage HVT (T14); and other CAM memory cells located between the CAM memory cell 702 and the CAM memory cell 701 may be encoded to have the middle threshold voltage LVTb (or LVTb1, LVTb2 . . . ) (T13) and the high threshold voltage HVT (T14).

In FIG. 7B, when the MSB of the search data F1 and F2 is not matched with the storage data of the CAM memory cell 701, MSB-mismatched is occurred; and when the LSB of the search data F1 and F2 is not matched with the storage data of the CAM memory cell 702, LSB-mismatched is occurred.

As shown in FIG. 7B, in searching operations, the cell currents from the CAM memory cells flow into the sensing amplifiers SA (also referred as the electrical characteristic detection circuit) coupled to the CAM memory cells; and the sensing results of the sensing amplifiers SA are summed to generate the search result.

When the match result indicates all-matched, the sensing amplifier SA detects no any cell current; when the match result indicates MSB-mismatched, the corresponding CAM memory cell provides high mismatched current and thus the sensing amplifier SA senses high cell current; and when the match result indicates LSB-mismatched, the corresponding CAM memory cell provides low mismatched current and thus the sensing amplifier SA senses low cell current. The summation of the sensing results of the sensing amplifiers SA may be used to determine whether the search result is all-matched, MSB-mismatched or LSB-mismatched.

Eighth Embodiment

Figure 8A:
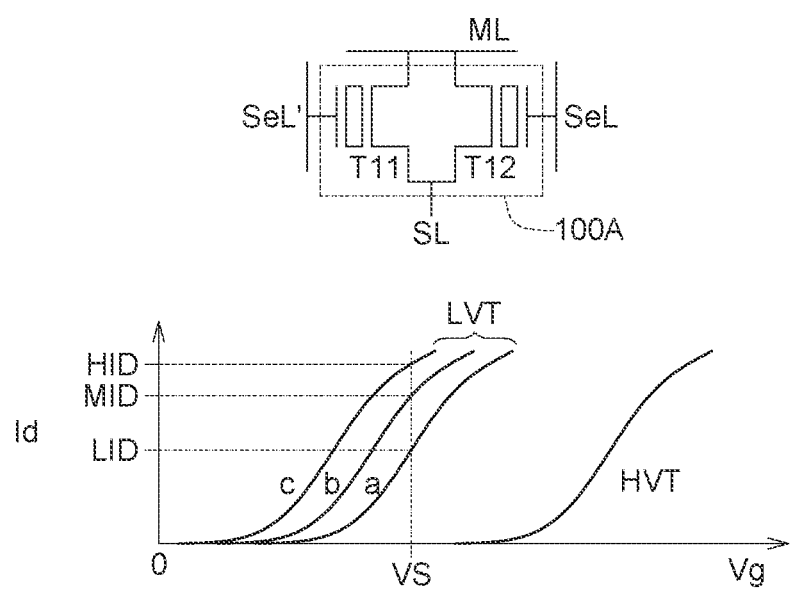
FIG. 8A is a schematic diagram of a TCAM memory cell and the voltage-current relationship curve according to the eighth embodiment of the present application.
Figure 8B:
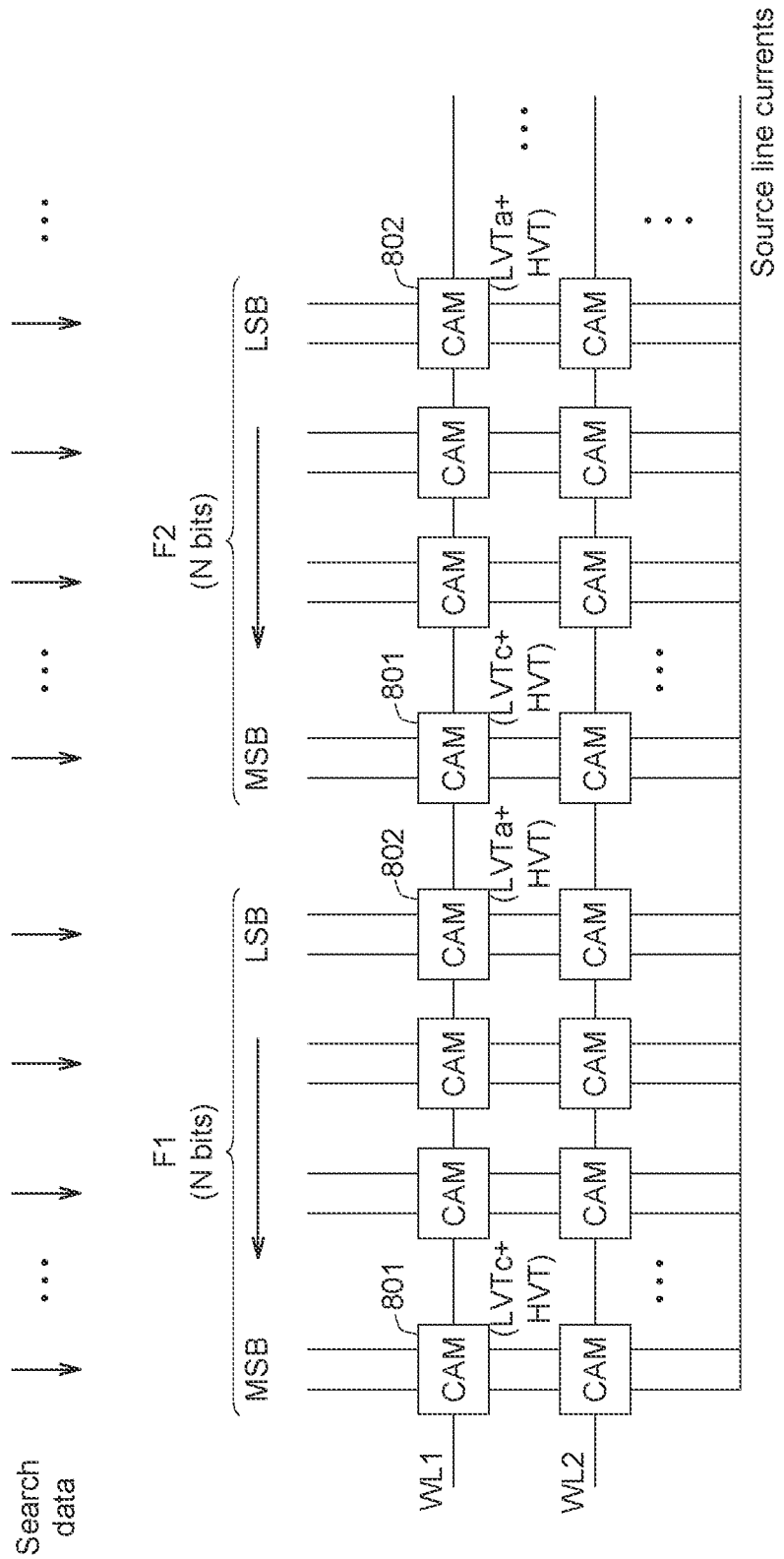
FIG. 8B is an operation diagram of the TCAM memory device according to the eighth embodiment of the present application.

FIG. 8A is a schematic diagram of a TCAM memory cell and the voltage-current relationship curve according to the eighth embodiment of the present application. FIG. 8B is an operation diagram of the TCAM memory device according to the eighth embodiment of the present application.

The eighth embodiment of the present application may be used in weighting each bit of the search data.

In search operation, taking the search data F1 and F2 as an example. The search data F1 and F2 both have N bits (N being a natural number). MSB (most significant bit) of the search data F1 and F2 may be encoded as 0V or VS (as the fifth embodiment) and LSB (least significant bit) of the search data F1 and F2 may be encoded as 0V or VS (as the fifth embodiment). As for the middle significant bits between the MSB and the LSB of the search data F1 and F2 may be encoded as 0V or VS to 0V or VS.

Further, the CAM memory cell 801 corresponding to the MSB of the search data F1 and F2 may be encoded to have the low threshold voltage LVTc (T13) and the high threshold voltage HVT (T14); the CAM memory cell 802 corresponding to the LSB of the search data F1 and F2 may be encoded to have the low threshold voltage LVTa (T13) and the high threshold voltage HVT (T14); and other CAM memory cells located between the CAM memory cell 802 and the CAM memory cell 801 may be encoded to have the middle threshold voltage LVTb (or LVTb1, LVTb2 . . . ) (T13) and the high threshold voltage HVT (T14).

In FIG. 8B, when the MSB of the search data F1 and F2 is not matched with the storage data of the CAM memory cell 801, MSB-mismatched is occurred; and when the LSB of the search data F1 and F2 is not matched with the storage data of the CAM memory cell 802, LSB-mismatched is occurred.

As shown in FIG. 8B, in searching operations, the cell currents from the CAM memory cells flow into the source lines; and the currents on the source lines are summed to generate the search result.

When the match result indicates all-matched, no any cell current is detected; when the match result indicates MSB-mismatched, the corresponding CAM memory cell provides high mismatched current and thus the sensing amplifier SA senses high cell current; and when the match result indicates LSB-mismatched, the corresponding CAM memory cell provides low mismatched current and thus the sensing amplifier SA senses low cell current. The summation of the currents on the source lines may be used to determine whether the search result is all-matched, MSB-mismatched or LSB-mismatched.

Ninth Embodiment

Figure 9:
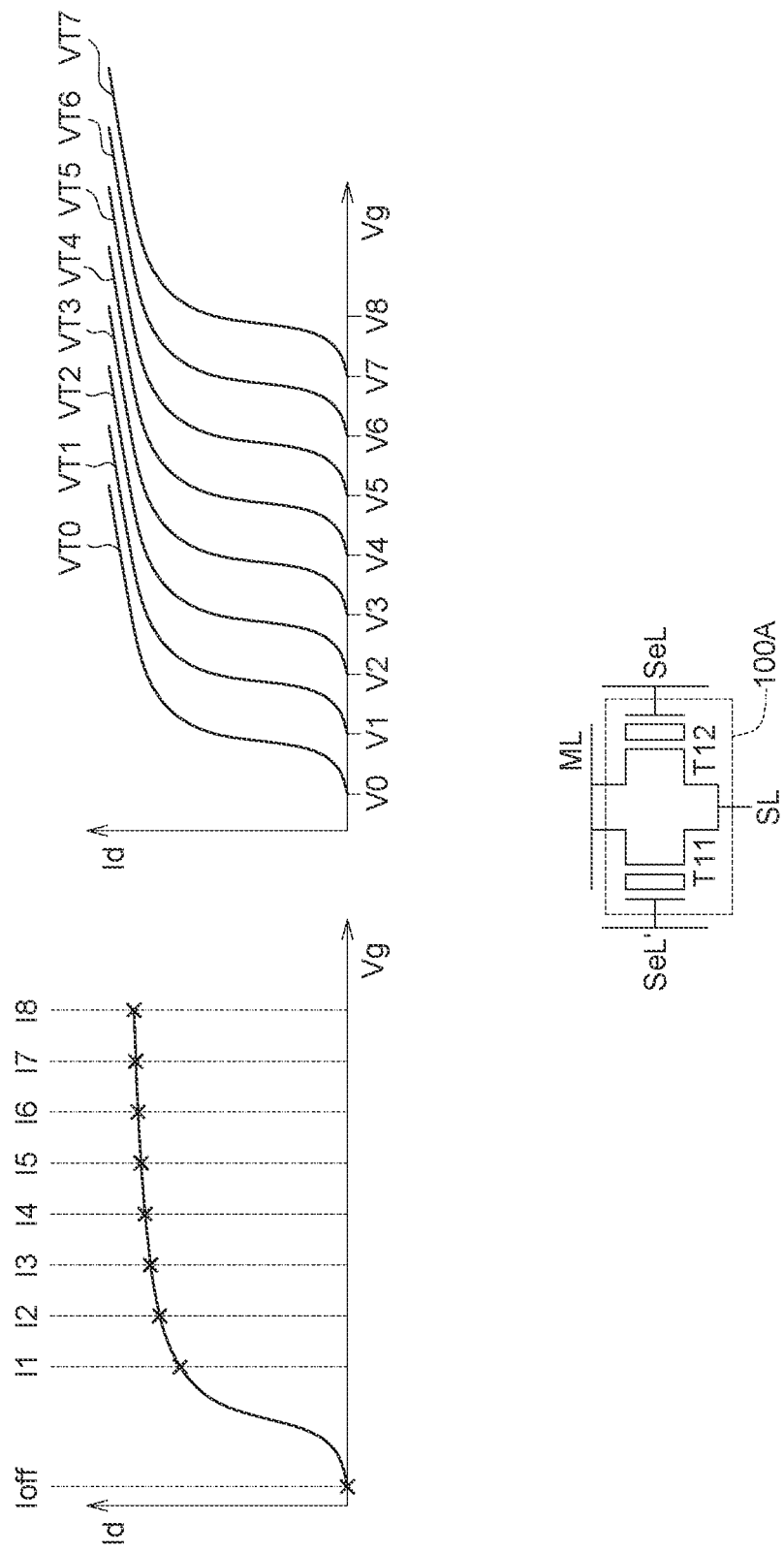
FIG. 9 is a schematic diagram of a TCAM memory cell and the voltage-current relationship curve according to the ninth embodiment of the present application.

FIG. 9 is a schematic diagram of a TCAM memory cell and the voltage-current relationship curve according to the ninth embodiment of the present application.

As shown in the voltage-current relationship curve in FIG. 9, the threshold voltages of the memory cells T11 and T12 may be set as a plurality of threshold voltages VT0~VT7.

In the case that the threshold voltage of the memory cell is VT0, when the search voltage is V0, the current of the memory cell is Ioff; when the search voltage is V1, the current of the memory cell is I1; and when the search voltage is V2, the current of the memory cell is I2. Others are so on.

In the ninth embodiment of the present application, encoding of the storage data and the search data are as the following table 15 and the table 16.

TABLE 15

| Storage data | T11 | T12 |
|---|---|---|
| 0 | VT0 | VT7 |
| 1 | VT1 | VT6 |
| 2 | VT2 | VT5 |
| 3 | VT3 | VT4 |
| 4 | VT4 | VT3 |
| 5 | VT5 | VT2 |
| 6 | VT6 | VT1 |
| 7 | VT7 | VT0 |
| X (Don't care) | VT7 | VT7 |

TABLE 16

| Search data | SeL' | SeL |
|---|---|---|
| 0 | V0 | V7 |
| 1 | V1 | V6 |
| 2 | V2 | V5 |
| 3 | V3 | V4 |
| 4 | V4 | V3 |
| 5 | V5 | V2 |
| 6 | V6 | V1 |
| 7 | V7 | V0 |
| WC | V0 | V0 |
| Invalid | V8 | V8 |

In the table 15, when the threshold voltages of the memory cells T11 and T12 are VT0 and VT7, respectively, storage data of the CAM memory cell 100A is "0"; and others are so on.

As shown in the table 16, when the voltages on the search line SeL' and SeL are V0 and V7 respectively, the search data is 0 and so on.

In the case that the storage data is 0 (the memory cell T11 has the threshold voltage VT0 and the memory cell T12 has the threshold voltage VT7), when the search data is 0 (SeL' is V0 and SeL is V7), the memory cell T11 does not provide any cell current (because the memory cell T11 has the threshold voltage VT0 and SeL' is V0, as shown from the voltage-current relationship curve in FIG. 9, the memory cell T11 does not provide any cell current); and the memory cell T12 does not provide any cell current (because the memory cell T12 has the high threshold voltage VT7 and SeL is V7, as shown from the voltage-current relationship curve in FIG. 9, the memory cell T12 does not provide any cell current).

Thus, the tables 17-1 and 17-2 show the search result in the ninth embodiment of the application.

TABLE 17-1

|  | Search data 0 | Search data 1 | Search data 2 | Search data 3 | Search data 4 |
|---|---|---|---|---|---|
| Storage data 0 | Ioff | I1 | I2 | I3 | I4 |
| Storage data 1 | I1 | Ioff | I1 | I2 | I3 |
| Storage data 2 | I2 | I1 | Ioff | I1 | I2 |
| Storage data 3 | I3 | I2 | I1 | Ioff | I1 |
| Storage data 4 | I4 | I3 | I2 | I1 | Ioff |
| Storage data 5 | I5 | I4 | I3 | I2 | I1 |
| Storage data 6 | I6 | I5 | I4 | I3 | I2 |
| Storage data 7 | I7 | I6 | I5 | I4 | I3 |

TABLE 17-1-continued

| | Search data 0 | Search data 1 | Search data 2 | Search data 3 | Search data 4 |
|---|---|---|---|---|---|
| Storage data X | Ioff | Ioff | Ioff | Ioff | Ioff |

TABLE 17-2

| | Search data 5 | Search data 6 | Search data 7 | Search data WC | Search data: invalid data |
|---|---|---|---|---|---|
| Storage data 0 | I5 | I6 | I7 | Ioff | I8 + I1 |
| Storage data 1 | I4 | I5 | I6 | Ioff | I7 + I2 |
| Storage data 2 | I3 | I4 | I5 | Ioff | I6 + I3 |
| Storage data 3 | I2 | I3 | I4 | Ioff | I5 + I4 |
| Storage data 4 | I1 | I2 | I3 | Ioff | I4 + I5 |
| Storage data 5 | Ioff | I1 | I2 | Ioff | I3 + I6 |
| Storage data 6 | I1 | Ioff | I1 | Ioff | I2 + I7 |
| Storage data 7 | I2 | I1 | Ioff | Ioff | I1 + I8 |
| Storage data X | Ioff | Ioff | Ioff | Ioff | I1 + I1 |

In the ninth embodiment, when the search result is matched, the CAM memory cell does not provide any current. When the search is mismatched, based on the mismatch degree, the CAM memory cell provides mismatched current I1~I8, wherein I8>I7>I6>I5>I4>I3>I2>I1>Ioff.

In the ninth embodiment, by adjusting the search voltages of the search data and by adjusting the threshold voltages of the CAM memory cells, when the CAM memory cell is a single-bit multi-level memory cell and the search data is a single-bit multi-level search data, different levels of mismatched currents are generated for representing difference in similarity degree.

The ninth embodiment has more possible examples. In other possible examples, the storage data is shown in the table 18 and the search data is shown in the table 19.

TABLE 18

| Storage data | T11 | T12 |
|---|---|---|
| 0 | VT0 | VTN |
| 1 | VT1 | VT(N-1) |
| 2 | VT2 | VT(N-2) |
| ... | ... | ... |
| N-2 | VT(N-2) | VT2 |
| N-1 | VT(N-1) | VT1 |
| N | VTN | VT0 |
| X (Don't care) | VTN | VTN |

TABLE 19

| Search data | SeL' | SeL |
|---|---|---|
| 0 | V0 | VN |
| 1 | V1 | V(N-1) |
| ... | ... | ... |
| N-1 | V(N-1) | V1 |
| N | VN | V0 |

TABLE 19-continued

| Search data | SeL' | SeL |
|---|---|---|
| WC | V0 | V0 |
| Invalid | VN | VN |

Table 20 shows search result.

TABLE 20

| | Search data 0 | Search data 1 | ... | Search data N | Search data WC | Invalid search data |
|---|---|---|---|---|---|---|
| Storage data 0 | ○ (no current) | X (current I1) | ... | X (current IN) | ○ (no current) | X (high current) |
| Storage data 1 | X (current I1) | ○ (no current) | ... | X (current I(N − 1)) | ○ (no current) | X (high current) |
| ... | ... | ... | ... | ... | ... | ... |
| Storage data N | X (current IN) | X (current I(N − 1)) | ... | ○ (no current) | ○ (no current) | X (high current) |
| Storage data X | ○ (no current) | ○ (no current) | ... | ○ (no current) | ○ (no current) | X (high current) |

(1) I1 < I2 ... I(N − 1) < IN;
(2) ○: matched, X: mismatched

Tenth Embodiment

Figure 10A:
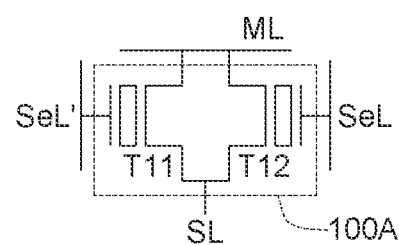
FIG. 10A is a schematic diagram of a TCAM memory cell and the voltage-current relationship curve according to the tenth embodiment of the present application.
Figure 10A:
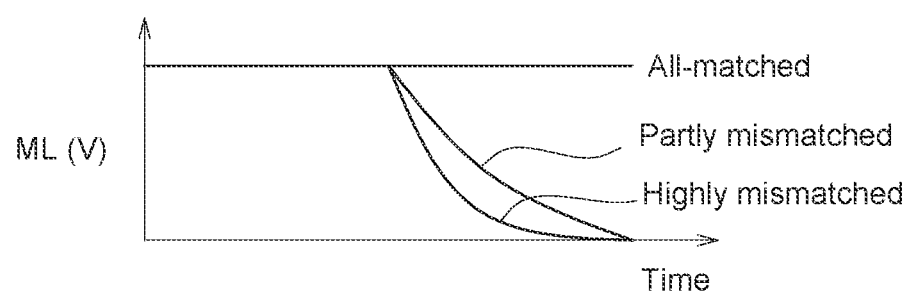
Figure 10B:
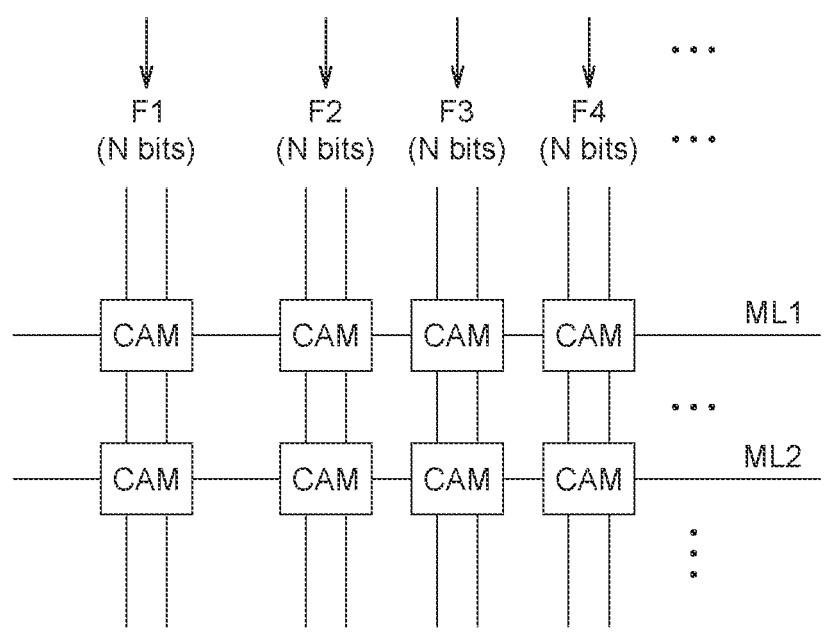
FIG. 10B is an operation diagram of the TCAM memory device according to the tenth embodiment of the present application.

FIG. 10A is a schematic diagram of a TCAM memory cell and the voltage-current relationship curve according to the tenth embodiment of the present application. FIG. 10B is an operation diagram of the TCAM memory device according to the tenth embodiment of the present application.

The tenth embodiment of the present application may be used in approximate searching.

In searching, the search voltages of the search data F1, F2 ... and the threshold voltages of the CAM memory cells are set as in the ninth embodiment.

As shown in FIG. 10A, when the match result indicates all-matched, the match line voltage on the match line ML1 and/or ML2 is not discharged; when the match result indicates MSB-mismatched, the match line voltage on the match line ML1 and/or ML2 is fast discharged; and when the match result indicates LSB-mismatched, the match line voltage on the match line ML1 and/or ML2 is slowly discharged.

Figure 11:
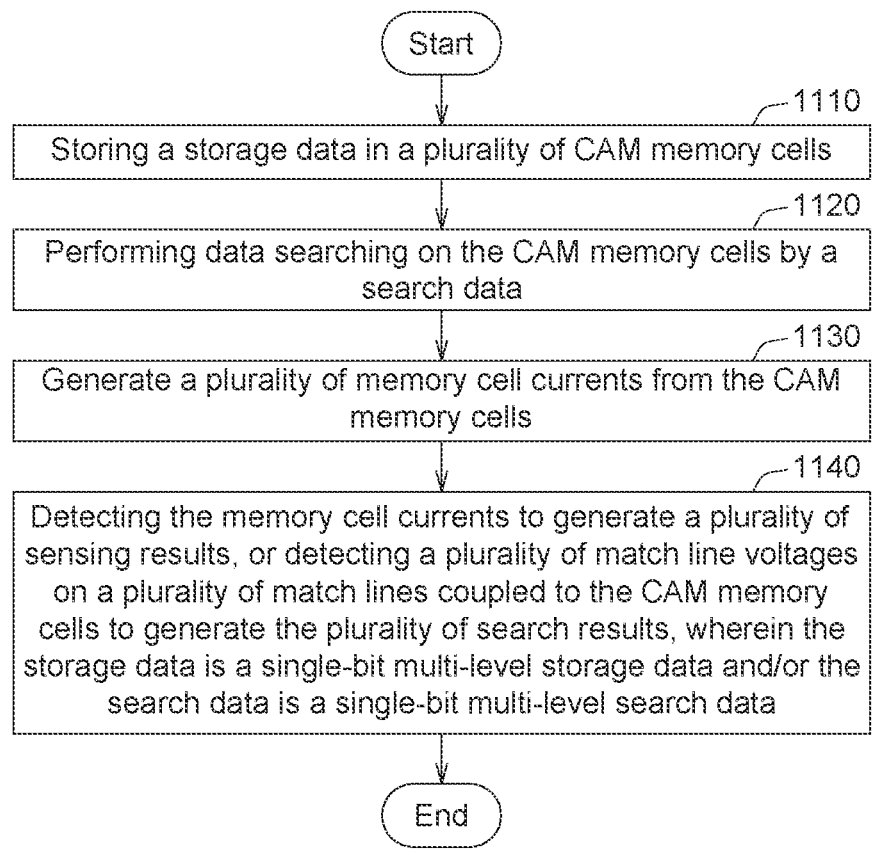
FIG. 11 shows a flow chart of a method for searching and comparing data for a CAM memory device according to one embodiment of the application.

FIG. 11 shows a flow chart of a method for searching and comparing data for a CAM memory device according to one embodiment of the application. The data search and comparing method for the CAM memory device comprises: storing a storage data in a plurality of CAM memory cells (1110); performing data searching on the CAM memory cells by a search data (1120); generate a plurality of memory cell currents from the CAM memory cells (1130); and detecting the memory cell currents to generate a plurality of sensing results, or detecting a plurality of match line voltages on a plurality of match lines coupled to the CAM memory cells to generate the plurality of search results, wherein the storage data is a single-bit multi-level storage data and/or the search data is a single-bit multi-level search data (1140).

In above embodiments of the present application, the CAM memory device can be realized as a two-dimensional (2D) flash memory architecture or a three-dimensional (3D) flash memory architecture, and is still within the spirit of the present application.

In above embodiments of the present application, the CAM memory cells may be implemented by Vt change memory cells or resistance change memory cells. The Vt change memory cells may be for example but not limited by, charge storage flash memory cells (floating gate memory cells etc.), charge trapping flash memory cells (SONOS memory cells, MONOS memory cells etc.), split gate flash memory cells, read-only memory (ROM), Programmable read-only memory (PROM), Erasable Programmable Read-Only Memory EPROM), One Time Programmable Read Only Memory (OTPROM), Electrically-Erasable Programmable Read-Only Memory (EEPROM), ferroelectric-gated field-effect-transistor (FeFET) and so on. The resistance change memory cells may be implemented by, for example but not limited by, Resistive random-access memory (RRAM), conductive-bridging random access memory (CBRAM), phase change memory (PCM), Magnetoresistive Random Access Memory (MRAM), ferroelectric tunnel junction (FTJ), tunable resistor, oxide with different dopant concentration and so on.

The embodiments of the application may be used in implementing in-memory searching (IMS) approximate searching and ISM weighted searching. The approximate searching and the weighted searching are observed through different levels of match/mismatch output signals.

In the above embodiments of the application, the output signal having large change may represent MSB while the output signal having middle change may represent LSB. Thus, the MSB mismatch may cause higher mismatch signal than the LSB mismatch.

In the above embodiments of the application, one CAM memory cell may represent one value. The above embodiments of the application may implement approximate match.

The above embodiments of the application may be used in the binary CAM (BCAM), Ternary CAM (TCAM), multi-level CAM (MCAM) and analog CAM (ACAM).

In the above embodiments of the application, a lot of methods may be used to sense the output signals based on, for example but not limited by, the match line discharge speed, the summed CAM cell currents from the sensing amplifiers, or the summed CAM cells on the signal lines.

The above embodiments of the application may be used in binary numeral systems, ternary numeral systems, or other high numeral systems. The above embodiments of the application may be also used in analog systems.

In the above embodiments of the application, highly mismatched data causes high mismatch signal wile matched data causes low mismatch signal. Or, in other possible embodiments of the application, highly matched data causes high match signal wile mismatched data causes low match signal.

In one embodiment of the application, in performing in-memory approximate search, data search and data comparison are completed during one read cycle. Accompanied by high storage density of the CAM memory device, the in-memory approximate search may be applicable in different field, for example but not limited by, Big-data searching, AI (artificial intelligence) hardware accelerator/classifier, Approximate Computing, Associative memory, Solid-state drive (SSD) data management, deoxyribonucleic acid (DNA) matching, Data filter and so on.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A content addressable memory (CAM) memory device, comprising:
a plurality of CAM memory cells; and
an electrical characteristic detection circuit coupled to the CAM memory cells;
wherein
in data searching, a search data is compared with a storage data stored in the CAM memory cells, the CAM memory cells generate a plurality of memory cell currents, the electrical characteristic detection circuit detects the memory cell currents to generate a plurality of sensing results, or the electrical characteristic detection circuit detects a plurality of match line voltages on a plurality of match lines coupled to the CAM memory cells to generate the plurality of search results;
the storage data is a single-bit multi-level storage data and/or the search data is a single-bit multi-level search data.

2. The CAM memory device according to claim 1, wherein
each of the CAM memory cells includes a first memory cell and a second memory cell,
the first memory cell and the second memory cell receive a first search voltage and a second voltage of the search data,
when a threshold voltage of the first memory cell is a first threshold voltage and a threshold voltage of the second memory cell is a second threshold voltage, the storage data is a single-bit single-level storage data; and
when the first search voltage is a first voltage value and the second search voltage is one among at least three reference search voltages, the search data is a single-bit multi-level search data.

3. The CAM memory device according to claim 2, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

4. The CAM memory device according to claim 1, wherein
each of the CAM memory cells includes a first memory cell and a second memory cell,
the first memory cell and the second memory cell receive a first search voltage and a second voltage of the search data,
when a threshold voltage of the first memory cell is a first threshold voltage and a threshold voltage of the second memory cell is selected among at least three reference threshold voltages, the storage data is the single-bit multi-level storage data; and
when the first search voltage is a first voltage value and the second search voltage is a second voltage value, the search data is a single-bit single-level search data.

5. The CAM memory device according to claim 4, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

6. The CAM memory device according to claim 1, wherein
each of the CAM memory cells includes a first memory cell and a second memory cell,
the first memory cell and the second memory cell receive a first search voltage and a second voltage of the search data,
when a threshold voltage of the first memory cell and a threshold voltage of the second memory cell are selected among at least three reference threshold voltages, the storage data is the single-bit multi-level storage data; and
when the first search voltage and the second search voltage are selected among at least three reference search voltages, the search data is the single-bit multi-level search data.

7. The CAM memory device according to claim 6, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

8. A data search and comparing method for a content addressable memory (CAM) memory device, the method comprising:
storing a storage data in a plurality of CAM memory cells;
performing data searching on the CAM memory cells by a search data;
generate a plurality of memory cell currents from the CAM memory cells; and
detecting the memory cell currents to generate a plurality of sensing results, or detecting a plurality of match line voltages on a plurality of match lines coupled to the CAM memory cells to generate the plurality of search results;
wherein the storage data is a single-bit multi-level storage data and/or the search data is a single-bit multi-level search data.

9. The data search and comparing method for the CAM memory device according to claim 8, wherein
each of the CAM memory cells includes a first memory cell and a second memory cell,
the first memory cell and the second memory cell receive a first search voltage and a second voltage of the search data,
when a threshold voltage of the first memory cell is a first threshold voltage and a threshold voltage of the second memory cell is a second threshold voltage, the storage data is a single-bit single-level storage data; and
when the first search voltage is a first voltage value and the second search voltage is one among at least three reference search voltages, the search data is a single-bit multi-level search data.

10. The data search and comparing method for the CAM memory device according to claim 9, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

11. The data search and comparing method for the CAM memory device according to claim 8, wherein
each of the CAM memory cells includes a first memory cell and a second memory cell,
the first memory cell and the second memory cell receive a first search voltage and a second voltage of the search data,
when a threshold voltage of the first memory cell is a first threshold voltage and a threshold voltage of the second memory cell is selected among at least three reference threshold voltages, the storage data is the single-bit multi-level storage data; and
when the first search voltage is a first voltage value and the second search voltage is a second voltage value, the search data is a single-bit single-level search data.

12. The data search and comparing method for the CAM memory device according to claim 11, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

13. The data search and comparing method for the CAM memory device according to claim 8, wherein
each of the CAM memory cells includes a first memory cell and a second memory cell,
the first memory cell and the second memory cell receive a first search voltage and a second voltage of the search data,
when a threshold voltage of the first memory cell and a threshold voltage of the second memory cell are selected among at least three reference threshold voltages, the storage data is the single-bit multi-level storage data; and
when the first search voltage and the second search voltage are selected among at least three reference search voltages, the search data is the single-bit multi-level search data.

14. The data search and comparing method for the CAM memory device according to claim 13, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

15. A content addressable memory (CAM) memory cell including:
a first memory cell and a second memory cell coupled to each other;
wherein
the first memory cell and the second memory cell receive a first search voltage and a second search voltage representing a search data;
wherein a storage data of the CAM memory cell is a single-bit multi-level storage data and/or the search data is a single-bit multi-level search data.

16. The CAM memory cell according to claim 15, wherein
when a threshold voltage of the first memory cell is a first threshold voltage and a threshold voltage of the second memory cell is a second threshold voltage, the storage data is a single-bit single-level storage data; and when the first search voltage is a first voltage value and the second search voltage is one among at least three reference search voltages, the search data is a single-bit multi-level search data.

17. The CAM memory cell according to claim 16, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

18. The CAM memory cell according to claim 15, wherein
the first memory cell and the second memory cell receive the first search voltage and the second search voltage of the search data,
when a threshold voltage of the first memory cell is a first threshold voltage and a threshold voltage of the second memory cell is selected among at least three reference threshold voltages, the storage data is the single-bit multi-level storage data; and
when the first search voltage is a first voltage value and the second search voltage is a second voltage value, the search data is a single-bit single-level search data.

19. The CAM memory cell according to claim 18, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

20. The CAM memory cell according to claim 15, wherein
the first memory cell and the second memory cell receive the first search voltage and the second search voltage of the search data,
when a threshold voltage of the first memory cell and a threshold voltage of the second memory cell are selected among at least three reference threshold voltages, the storage data is the single-bit multi-level storage data; and
when the first search voltage and the second search voltage are selected among at least three reference search voltages, the search data is the single-bit multi-level search data.

21. The CAM memory cell according to claim 20, wherein
when the search data is matched with the storage data, the CAM memory cell does not provide any memory cell current; and
when the search data is mismatched with the storage data, the CAM memory cell provides the memory cell current which is corresponding to a mismatch degree between the storage data and the search data.

* * * * *